(12) United States Patent
Trojan et al.

(10) Patent No.: US 12,217,979 B2
(45) Date of Patent: Feb. 4, 2025

(54) TEMPERATURE CONTROLLED SUBSTRATE CARRIER AND POLISHING COMPONENTS

(71) Applicant: Axus Technology, LLC, Chandler, AZ (US)

(72) Inventors: Daniel Ray Trojan, Chandler, AZ (US); John Kevin Shugrue, Phoenix, AZ (US)

(73) Assignee: Axus Technology, LLC, Chandler, AZ (US)

( * ) Notice: Subject to any disclaimer, the term of this patent is extended or adjusted under 35 U.S.C. 154(b) by 0 days.

(21) Appl. No.: 16/913,252

(22) Filed: Jun. 26, 2020

(65) Prior Publication Data

US 2021/0005479 A1    Jan. 7, 2021

Related U.S. Application Data

(60) Provisional application No. 62/912,523, filed on Oct. 8, 2019, provisional application No. 62/869,427, filed on Jul. 1, 2019.

(51) Int. Cl.
| | |
|---|---|
| *H01L 21/67* | (2006.01) |
| *B24B 37/04* | (2012.01) |

(Continued)

(52) U.S. Cl.
CPC ........ *H01L 21/67103* (2013.01); *B24B 37/04* (2013.01); *B24B 37/32* (2013.01); *B24B 55/02* (2013.01); *H01L 21/30625* (2013.01); *H01L 21/3212* (2013.01); *H01L 21/68757* (2013.01); *H01L 21/0475* (2013.01)

(58) Field of Classification Search
None
See application file for complete search history.

(56) References Cited

U.S. PATENT DOCUMENTS

| | | | | |
|---|---|---|---|---|
| 5,980,368 | A | * | 11/1999 | Chang ..................... B24B 37/16 451/303 |
| 6,056,632 | A | * | 5/2000 | Mitchel ................... B24B 37/32 451/286 |

(Continued)

FOREIGN PATENT DOCUMENTS

| | | |
|---|---|---|
| JP | H09255289 A | 9/1997 |
| JP | H09-277164 | 10/1997 |

(Continued)

OTHER PUBLICATIONS

Int'l Search Report from related PCT App. No. PCT/US20/39767 dated Nov. 20, 2020 (17 pgs).

(Continued)

*Primary Examiner* — Sylvia MacArthur
(74) *Attorney, Agent, or Firm* — Knobbe, Martens, Olson & Bear, LLP

(57) ABSTRACT

Temperature controlled polishing pads are disclosed. In one aspect, a CMP system includes the use of any type of atomizing system to cool or remove energy and/or heat from the polishing pad of a CMP system. The atomizing system can use of any liquid medium in combination of any compressed gas through an orifice to cool or remove the energy and/or heat from the pad, thereby allowing for higher removal rates during CMP.

24 Claims, 15 Drawing Sheets

(51) Int. Cl.
  *B24B 37/32* (2012.01)
  *B24B 55/02* (2006.01)
  *H01L 21/306* (2006.01)
  *H01L 21/321* (2006.01)
  *H01L 21/687* (2006.01)
  *H01L 21/04* (2006.01)

(56) References Cited

U.S. PATENT DOCUMENTS

| | | | |
|---|---|---|---|
| 6,077,151 A * | 6/2000 | Black | B24B 49/04 |
| | | | 451/287 |
| 6,176,764 B1 * | 1/2001 | Gotcher | B24B 37/30 |
| | | | 451/287 |
| 6,375,549 B1 * | 4/2002 | Glashauser | B24B 37/30 |
| | | | 451/63 |
| 6,705,932 B1 * | 3/2004 | Zuniga | B24B 37/30 |
| | | | 451/285 |
| 6,926,585 B2 * | 8/2005 | Togawa | B24B 49/16 |
| | | | 451/6 |
| 8,734,661 B2 * | 5/2014 | Yamauchi | H01L 21/02019 |
| | | | 216/53 |
| 10,442,056 B2 | 10/2019 | Namiki et al. | |
| 2001/0034198 A1 * | 10/2001 | Kimura | B24B 37/32 |
| | | | 451/287 |
| 2002/0132559 A1 * | 9/2002 | Togawa | B24B 47/06 |
| | | | 451/21 |
| 2002/0177395 A1 * | 11/2002 | Han | B24B 37/30 |
| | | | 451/288 |
| 2003/0203708 A1 | 10/2003 | Liu et al. | |
| 2005/0208880 A1 * | 9/2005 | Saito | B24B 49/14 |
| | | | 451/11 |
| 2005/0215182 A1 * | 9/2005 | Fuhriman | B24B 41/007 |
| | | | 451/287 |
| 2007/0111637 A1 * | 5/2007 | Togawa | H01L 21/67092 |
| | | | 451/1 |
| 2007/0227656 A1 * | 10/2007 | Boyd | C25F 7/00 |
| | | | 438/692 |
| 2009/0242125 A1 * | 10/2009 | Paik | H01L 21/6838 |
| | | | 51/299 |
| 2013/0136884 A1 * | 5/2013 | Yasuda | B32B 3/08 |
| | | | 428/64.1 |
| 2014/0242886 A1 * | 8/2014 | Woo | B24B 37/32 |
| | | | 451/286 |
| 2015/0196988 A1 | 7/2015 | Watanabe | |
| 2016/0039066 A1 | 2/2016 | Schauer | |
| 2016/0236318 A1 | 8/2016 | Choi et al. | |
| 2017/0047237 A1 * | 2/2017 | Kobata | H01L 21/30625 |
| 2017/0232574 A1 * | 8/2017 | Kim | B24B 37/20 |
| | | | 451/285 |
| 2017/0301563 A1 * | 10/2017 | Wu | H01L 21/6838 |
| 2017/0365463 A1 | 12/2017 | Aigo et al. | |
| 2018/0304434 A1 | 10/2018 | Sakugawa et al. | |
| 2018/0311784 A1 | 11/2018 | Trojan | |
| 2020/0381262 A1 | 12/2020 | Trojan et al. | |
| 2021/0005479 A1 * | 1/2021 | Trojan | H01L 21/67103 |

FOREIGN PATENT DOCUMENTS

| | | | | |
|---|---|---|---|---|
| JP | 2000228377 A | 8/2000 | | |
| JP | A-2002527894 | 8/2002 | | |
| JP | A-2004243518 | 9/2004 | | |
| JP | 2006202892 A | 8/2006 | | |
| JP | A-2006202892 | 8/2006 | | |
| JP | 2009088067 A | 4/2009 | | |
| JP | 2014008570 A | 1/2014 | | |
| JP | 2014083618 A | 5/2014 | | |
| WO | WO 2000/021715 A2 | 4/2000 | | |
| WO | WO-02096601 A1 * | 12/2002 | | B24B 37/30 |
| WO | WO 2004/027837 A1 | 4/2004 | | |
| WO | WO 2006/127780 A2 | 11/2006 | | |
| WO | WO 2010/021297 A1 | 2/2010 | | |
| WO | WO 2012/021215 A2 | 2/2012 | | |

OTHER PUBLICATIONS

Extended European Search Report received in EP Application No. 20834902.7, dated Jul. 7, 2023 (7 pages).

* cited by examiner

830 ⇘

838 ⇘

TEMPERATURE CONTROLLED SUBSTRATE CARRIER AND POLISHING COMPONENTS

INCORPORATION BY REFERENCE TO ANY PRIORITY APPLICATIONS

This application is a utility application claiming the benefit of the earlier filing date of provisional application Ser. No. 62/869,427 filed Jul. 1, 2019, and the earlier filing date of provisional application Ser. No. 62/912,523 filed Oct. 8, 2019, each which is hereby incorporated by reference in its entirety.

BACKGROUND

Field

This disclosure is generally related to substrate processing equipment, and more specifically, to a system and apparatus for improving chemical mechanical planarization (CMP) performance for the planarization of thin films.

Description of the Related Technology

During chemical mechanical planarization or polishing (CMP), an abrasive and either acidic or alkalinic slurry is applied via a metering pump or mass-flow-control regulator system onto a rotating polishing pad/platen. A wafer is held by a wafer carrier which is rotated and pressed against a polishing platen for a specified period of time. The wafer is polished or planarized by both abrasion and corrosion during the CMP process. The interaction between the wafer and the carrier during processing may cause wafer breakage, non-uniformity, or other issues. Thus, there is a need to improve wafer carrier performance to address the effects caused by the interaction between the wafer and the carrier during processing.

SUMMARY

For purposes of summarizing the disclosure and the advantages achieved over the prior art, certain objects and advantages of the disclosure are described herein. Not all such objects or advantages may be achieved in any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

One aspect of the disclosed technology is a substrate carrier head, comprising: a carrier body; a substrate retainer attached to the carrier body, the substrate retainer comprising an aperture configured to receive a substrate; a resilient membrane having a first surface configured to contact a surface of the substrate and a second surface opposing the first surface; a membrane cavity formed along the second surface; an inlet configured to allow liquid to flow into the membrane cavity; and an outlet configured to allow liquid to flow from the membrane cavity.

According to an embodiment, the outlet is located at a farther radial position from a center of the carrier body than the inlet.

According to an aspect, the inlet is located at approximately the center of the carrier body.

According to another aspect, the substrate carrier head further comprises: a secondary resilient membrane having a width that is less than a width of the resilient membrane.

According to another aspect, the substrate carrier further comprises a liquid tight seal between the resilient membrane and the carrier body.

Another aspect of the disclosed technology is a substrate carrier system, comprising: a substrate carrier head, comprising: a carrier body; a substrate retainer attached to the carrier body, the substrate retainer configured to retain a substrate on the carrier body; a resilient membrane having a first surface configured to contact a surface of the substrate and a second surface opposing the first surface; and a membrane cavity formed along the second surface, the membrane cavity configured to allow a liquid to flow along the second surface; and a control system configured to regulate at least one of a pressure and a flow-rate of the liquid through the membrane cavity.

According to an embodiment, the substrate carrier head further comprises: an inlet configured to allow liquid to flow into the membrane cavity; and an outlet configured to allow liquid to flow from the membrane cavity.

According to an aspect, the control system is further configured to recirculate the liquid from the outlet back into the inlet.

According to another aspect, the outlet is located at a farther radial position from a center of the carrier body than the inlet.

According to yet another aspect, the inlet is located at approximately the center of the carrier body.

According to still yet another aspect, the control system is further configured to cool the liquid below an ambient temperature.

According to an aspect, the substrate carrier system further comprises: a liquid source fluidly connected to the membrane cavity.

According to another aspect, the substrate carrier head further comprises: a secondary resilient membrane having a width that is less than a width of the resilient membrane.

According to yet another aspect, the resilient membrane is substantially entirely imperforated.

According to still yet another aspect, the control system includes a fluid back pressure regulator configured to control the liquid pressure.

According to an aspect, the control system further includes a pneumatic regulator configured to provide a signal to the fluid back pressure regulator to control the liquid pressure.

According to another aspect, the substrate carrier system further comprises an air source fluidly connected to the pneumatic regulator.

According to yet another aspect, the substrate carrier system further comprises: a liquid aspirator configured to provide negative pressure to a liquid within the membrane cavity.

According to still yet another aspect, the substrate carrier system further comprises the substrate, wherein the substrate is a silicon carbide wafer.

According to an aspect, the substrate carrier system further comprises the liquid, wherein the liquid comprises water.

According to another aspect, the control system is further configured to cause the substrate carrier head to rotate at a speed of greater than 100 rpm.

According to yet another aspect, the control system is further configured to control the liquid pressure to a pressure above 6 psi.

According to still yet another aspect, the control system is further configured to control a temperature of the substrate during chemical mechanical polishing (CMP) to be less than 100° F.

According to an aspect, the substrate carrier system further comprises the substrate, wherein the substrate has a thickness of less than 600 μm.

According to another aspect, the substrate carrier system further comprises a slurry delivery system configured to deliver processing slurry to the substrate at a rate of less than 100 ml/min.

Yet another aspect of the disclosed technology is a method for cooling a substrate during chemical mechanical polishing (CMP) of the substrate, the method comprising: retaining a substrate within an aperture of a substrate retainer, the substrate retainer attached to a carrier body of a carrier head; supplying a liquid to a membrane cavity within the carrier head; and flowing the liquid within the membrane cavity along a first surface of a resilient membrane.

According to an aspect, the method further comprises regulating at least one of a pressure and a flow-rate of the liquid through the membrane cavity.

According to another aspect, the method further comprises: flowing the liquid through an inlet into the membrane cavity; and flowing the liquid through an outlet from the membrane cavity.

According to yet another aspect, the method further comprises: recirculating the liquid from the outlet back into the inlet.

According to still yet another aspect, the method further comprises: cooling the liquid below an ambient temperature.

According to an aspect, the method further comprises: controlling at least one of the flow rate and the pressure of the liquid within the membrane cavity to a selected value.

According to another aspect, controlling comprises controlling the pressure of the liquid via a fluid back pressure regulator positioned downstream of the membrane cavity.

According to yet another aspect, the method further comprises: providing negative pressure to the liquid for suction of the substrate against the membrane.

Still yet another aspect of the disclosed technology is a substrate carrier head, comprising: a carrier body; a substrate retainer attached to the carrier body, the substrate retainer comprising an aperture configured to receive a substrate; a liquid cavity formed adjacent to the substrate aperture; an inlet configured to allow liquid to flow into the liquid cavity; and an outlet configured to allow liquid to flow from the liquid cavity.

Another aspect of the disclosed technology is a chemical mechanical planarization (CMP) system, comprising: a polishing pad; a substrate carrier head configured to retain a wafer against the polishing pad; and an atomizer configured to atomize a liquid and spread a layer of the atomized liquid over a surface area of the polishing pad to allow the liquid to evaporate and pull heat directly from the surface of the polishing pad.

According to an aspect, the atomizer is further configured to force a compressed gas in combination with the liquid through an orifice to atomize the liquid.

According to another aspect, the polishing pad is formed of polyurethane.

According to yet another aspect, the amount of liquid provided to the polishing pad is low enough to prevent substantial drops in a removal rate due to changes in chemistry of a slurry applied to the polishing pad.

According to still yet another aspect, CMP system further comprises a retaining ring having a stepped shape.

According to an aspect, the retaining ring is formed of polyphenylene sulfide (PPS) or polyetheretherketone (PEEK).

According to another aspect, the retaining ring has a two-piece construction.

According to yet another aspect, the retaining ring has a surface area of less than 15 square inches.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The above, as well as additional objects, features and advantages of the present inventive concept, will be better understood through the following illustrative and non-limiting detailed description of embodiments of the present invention, with reference to the appended drawings. In the drawings like reference numerals will be used for like elements unless stated otherwise.

DETAILED DESCRIPTION OF CERTAIN ILLUSTRATIVE EMBODIMENTS

Figure 1:
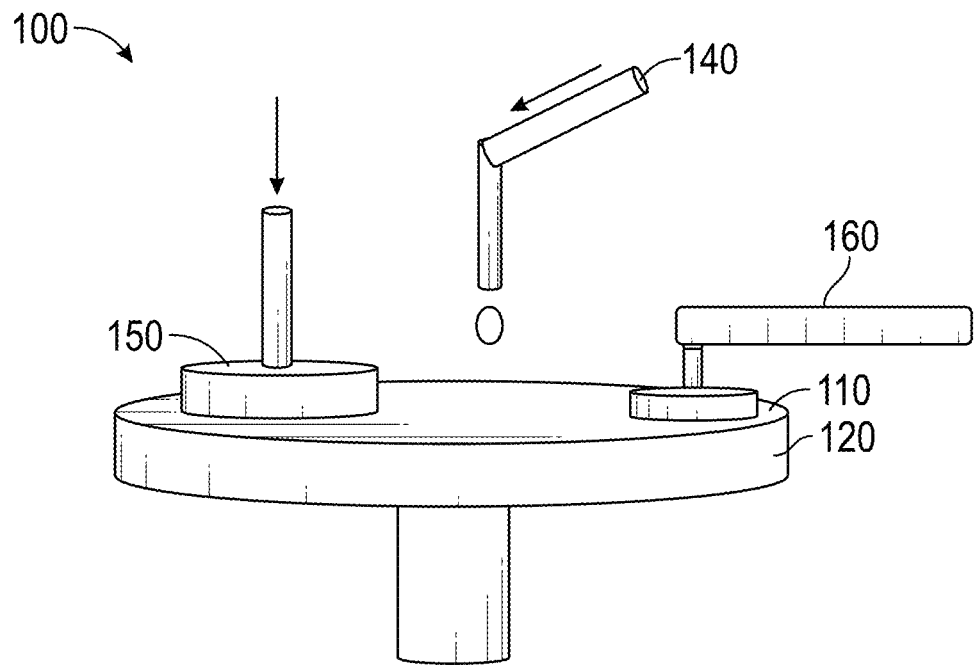
FIG. 1 is a schematic illustration of a substrate processing system, showing a substrate carrier holding a substrate in a processing position.

Although the following text sets forth a detailed description of numerous different embodiments of the invention, it should be understood that the legal scope of the invention is defined by the words of the claims set forth at the end of the patent. The detailed description is to be construed as exemplary only and does not describe every possible embodiment of the invention since describing every possible embodiment would be impractical, if not impossible. Numerous alternative embodiments could be implemented, using either current technology or technology developed after the filing date of this patent, which would still fall within the scope of the claims defining the invention.

Chemical Mechanical Planarization (CMP)

The adoption and use of chemical mechanical planarization (CMP) for the planarization of thin films in the manufacture of semiconductor ICs, MEMS devices, and LEDs, among many other similar applications, is common among companies manufacturing "chips" for these types of devices. This adoption includes the manufacture of chips for mobile telephones, tablets and other portable devices, plus desktop and laptop computers. The growth in nanotechnology and micro-machining holds great promise for ever-widespread use and adaptation of digital devices in the medical field, in the automotive field, and in the Internet of Things (the "IoT"). Chemical mechanical planarization for the planarization of thin films was invented and developed in the early 1980's by scientists and engineers at the IBM Corporation. Today, this process is widespread on a global basis and is one of the truly enabling technologies in the manufacture of many digital devices.

Integrated circuits are manufactured with multiple layers and alternating layers of conducting materials (e.g., copper, tungsten, aluminium, etc.), insulating layers (e.g., silicon dioxide, silicon nitride, etc.), and semiconducting material (e.g., polysilicon). A successive combination of these layers is sequentially applied to the wafer surface, but because of the implanted devices on the surface, topographical undulations are built up upon the device structures, as is the case with silicon dioxide insulator layers. These unwanted topographical undulations are often flattened or "planarized" using CMP, before the next layer can be deposited, to allow for proper interconnect between device features of ever decreasing size. In the case of copper layers, the copper is deposited on the surface to fill contact vias and make effective vertical paths for the transfer of electrons from device to device and from layer to layer. This procedure continues with each layer that is applied (usually applied by a deposition process). In the case of multiple layers of conducting material (multiple layers of metal), this could result in numerous polishing procedures (one for each layer of conductor, insulator, and semiconductor material) in order to achieve successful circuitry and interconnects between device features.

During the CMP process, the substrate or wafer is held by a wafer carrier which is rotated and pressed, generally via a resilient membrane within the wafer carrier, against the polishing platen for a specified period of time. CMP wafer carriers typically incorporate components for precision polishing of generally flat and round workpieces such as silicon wafers and/or films deposited on them on the process head. These components include: 1) the resilient membrane, with compressed gas applied to the top surface or back side of the membrane; said pressure is then transmitted via the membrane to the top surface or back side of the workpiece in order to effect the material removal during CMP; 2) one or more rigid support components which provide means for: fastening the membrane to its mating components, holding the membrane to its desired shape and dimension, and/or clamping the membrane to provide a sealed volume for sealing and containing the controlled gas pressure.

During the process, slurry is applied onto the rotating polishing pad via through a fluid control device, such as a metering pump or mass-flow-control regulator system. The slurry can be brought to the polishing platen in a single-pass distribution system. For better performance, the slurry particles in their media should be distributed evenly between the rotating wafer, and the rotating polishing pad/platen.

A force is applied to the backside of the wafer by the wafer carrier membrane to press it into the pad and both may have motion to create a relative velocity. The motion and force leads to portions of the pad creating abrasion by pushing the abrasive against the substrate while it moves across the wafer surface. The corrosive chemicals in the slurry alter the material being polished on the surface of the wafer. This mechanical effect of abrasion combined with chemical alteration is called chemical mechanical planarization or polishing (CMP). The removal rate of the material can be easily an order of magnitude higher with both the chemical and mechanical effects simultaneously compared to either one taken alone. Similarly, the smoothness of the surface after polishing is improved by using chemical and mechanical effects together.

During the polishing process, material such as copper, a dielectric, or polysilicon is removed from the surface of the wafer. These microscopic particles either remain in suspension in the slurry or become embedded in the polishing pad or both. These particles cause scratches on the surface of the film being polished, and thus catastrophic failures in the circuitry rendering the chip useless, thus becoming a major negative effect upon yield.

Yield is the driving force in determining success at the manufacturing level for many products including integrated circuits, MEMS, and LEDs. The surface quality tolerances for a CMP process within semiconductor manufacturing facilities ("fabs") and foundries are measured in nanometers and even Angstroms. The ability to remove material as uniformly as possible from the surface of a wafer or film during CMP is important. Therefore, carrier design technology is constantly evolving toward improving this capability. Small non-uniformities in the flatness of a wafer that has been processed in a CMP system can result in decreased yield and increased waste. Non-uniformities or pressure differentials across the diameters of the wafer carrier and the process pad can cause wafer breakage. The accumulated costs of manufacturing a solid state device are together termed the "Cost-of-Ownership" (CoO) and this term is also applied to each of the required manufacturing steps. The CoO of the CMP process is one of the highest CoO figures in the 500 to 800 individual manufacturing steps required to make a semiconductor "chip" and its associated digital device.

Wafers formed of silicon carbide may become more popular for a number of integrated circuit applications. For example, the automotive industry is anticipated to manufacture integrated circuits using silicon carbide wafers due to certain advantages of such silicon carbide wafers over the traditional silicon wafer. For example, in comparison to a silicon wafer-based integrated circuit, silicon carbide wafer-based integrated circuits may have lower power consumption and higher heat tolerance. Thus, as automotive vehicles increasingly use integrated circuits for control of various aspects of the vehicles, these control systems are increasingly being manufactured using silicon carbide wafers due to these desirable characteristics.

However, silicon carbide is a harder material than silicon. Thus, silicon carbide wafers may require higher pressures and/or speeds (e.g., the relative speed between the surface of the wafer and the polishing pad/platen) to achieve sufficient removal rates during CMP, relative to an otherwise similar silicon wafer-based CMP process. These increased pressures and/or speeds can lead to increased heat being generated during silicon carbide wafer CMP, relative to similar silicon wafer-based CMP. This increased heat in turn can adversely affect the wafer surface, polishing pad, and/or the resilient membrane contacting and applying pressure to the wafer. For example, excess heat may lead to surface defects on the wafer. Excess heat may cause the resilient membrane and/or polishing pad to melt and/or stick a wafer to the membrane or lose it from the carrier which can damage the wafer and carrier and/or prevent the wafer from unloading from the carrier. Thus, there is a need to provide cooling of the wafer and/or the resilient membrane to reduce the temperature during polishing. It will be understood that aspects of this disclosure may be implemented for substrates formed of materials other than silicon carbide, and may be implemented for both cooling, heating, or otherwise controlling desired temperature of a wafer, membrane, or other portions of a wafer carrier during any stage of a substrate process that has a substrate carrier, such as CMP.

The disclosed technology will be described with respect to particular embodiments and with reference to certain drawings. The disclosure is not limited thereto but only by the claims. The drawings described are only schematic and are non-limiting. In the drawings, the size of some of the elements may be exaggerated and not drawn to scale for illustrative purposes. The dimensions and the relative dimensions do not necessarily correspond to actual reductions to practice of the disclosure.

CMP System with Liquid Cooling

FIG. 1 is a schematic illustration of a chemical mechanical planarization system 100 for treating a polishing pad 110. System 100 can include a wafer carrier 150 configured to hold and process a wafer. It will be understood that the term "wafer" as used herein may refer to a semiconductor wafer (e.g., circular), but can more broadly encompass other types of substrates with different shapes which are processed by polishing or planarizing equipment, such as CMP equipment. Thus, in the following description, the terms "wafer" and "substrate" may be used interchangeably, unless the context clearly relates to only one "wafer" of "substrate" in particular. In the illustrated embodiment, the substrate carrier 150 is in a processing (e.g., lower) position, holding the substrate (not shown) against a polishing pad 110 with a membrane (not shown). The polishing pad 110 can be positioned on a supporting surface, such as a surface of a platen 120.

Figure 2:
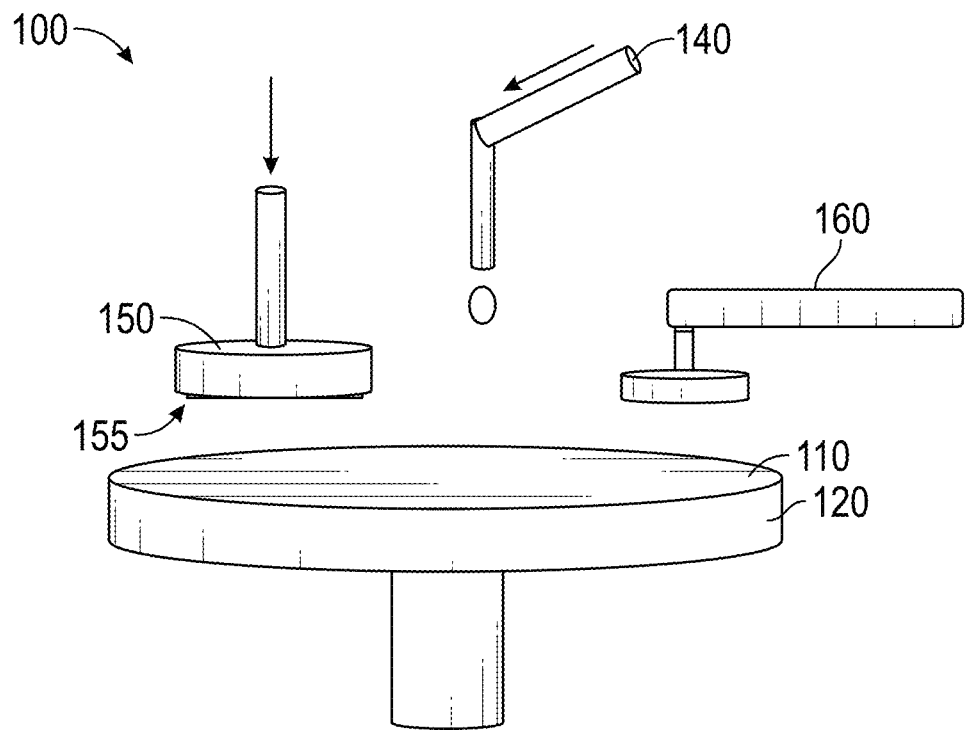
FIG. 2 is a view of the substrate processing system of FIG. 1, showing the substrate carrier holding the substrate in a loading position.

FIG. 2 is a view of the chemical mechanical planarization system of FIG. 1, showing a substrate 155 held by the substrate carrier 150 in a loading (e.g., upper) position. The substrate 155 can be held, for example, by force of a vacuum. Referring to both FIGS. 1 and 2, system 100 can include a slurry delivery system 140 configured to deliver the processing slurry to the substrate 155, and allow it to be chemically/mechanically planarized against the polishing pad 110. System 100 can include a pad conditioning arm 160, which includes a pad conditioner at its end, which can be configured to treat or "refresh" the surface roughness, or other processing characteristics of the pad, during or between processing cycles.

In the system 100 of FIGS. 1 and 2, polishing pad 110 is on the top surface of platen 120 which rotates counter clockwise about a vertical axis. Other orientations and directions of movement can be implemented.

The slurry delivery system 140 can deliver a slurry containing abrasive and corrosive particles to a surface of the treated polishing pad 130. The polishing slurries are typically colloidal suspensions of abrasive particles, i.e. colloidal silica, colloidal alumina, or colloidal ceria, in a water based medium. In various embodiments, the slurry delivery system 140 includes a metering pump, mass-flow-control regulator system, or other suitable fluid delivery components.

The substrate carrier 150 can hold substrate 155, for example, with a vacuum, so that the surface of the substrate 155 to be polished faces towards polishing pad 110. Abrasive particles and corrosive chemicals in the slurry deposited by the slurry delivery system 140 on the polishing pad 110 mechanically and chemically polish the substrate through abrasion and corrosion, respectively. The substrate carrier 155 and polishing pad 110 can move relative to each other in any of a number of different ways, to provide the polishing. For example, the substrate carrier 150 can apply a downward force against the platen 120 so that the substrate 155 is pressed against the polishing pad 110. The substrate 155 can be pressed against the polishing pad 110 with a pressurized membrane (not shown), as will be described further herein. Abrasive particles and corrosive chemicals of the slurry between the substrate 155 and the polishing pad 110 can provide chemical and mechanical polishing as the polishing pad 110 and substrate carrier 155 move relative to each other. The relative motion between polishing pads and substrate carriers can be configured in various ways, and either or both can be configured to oscillate, move linearly, and/or rotate, counter clockwise and/or clockwise relative to each other.

Pad conditioning arm 160 can condition the surface of polishing pad 110, by pressing against polishing pad 110 with a force, with relative movement therebetween, such as the relative motion described above with respect to the polishing pad and substrate carrier 150. The pad conditioning arm 160 in the illustrated embodiment can oscillate, with a rotating pad conditioner at its end, which contacts the polishing pad 110.

Figure 3:
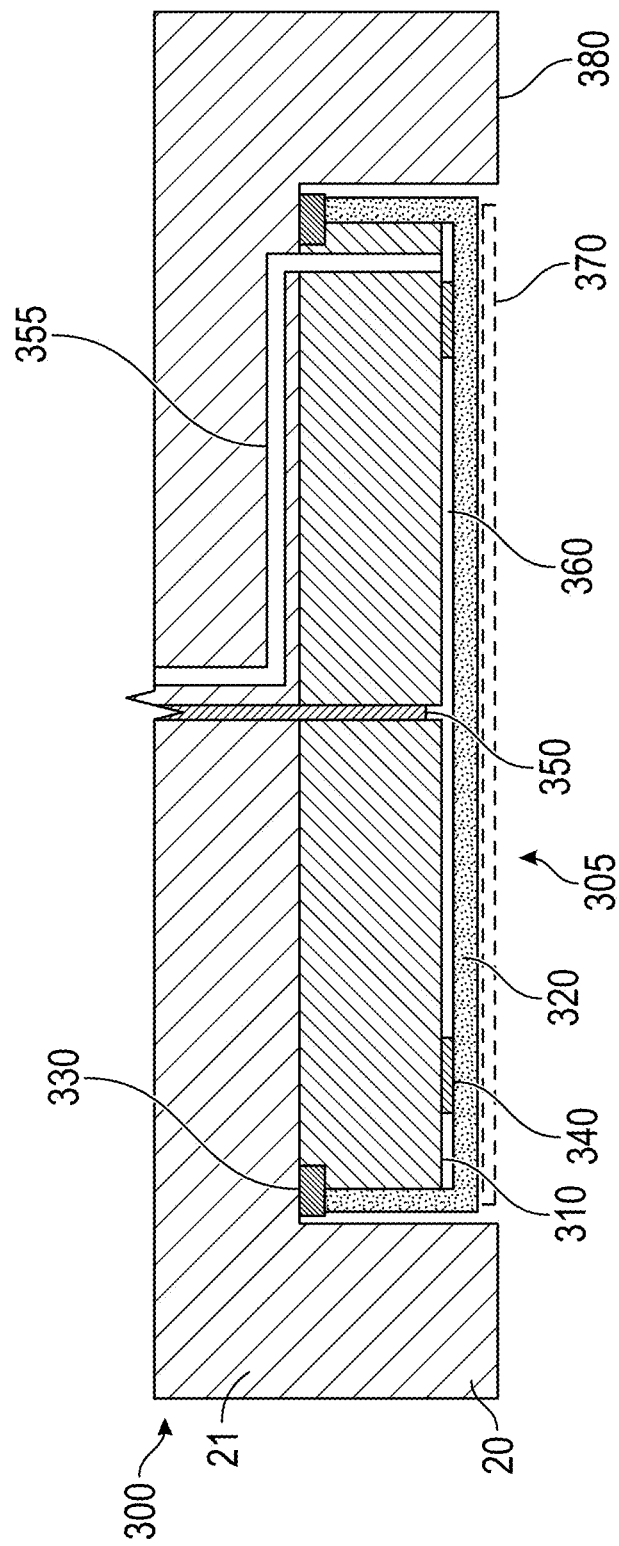
FIG. 3 is a partial cross-sectional view of a substrate carrier head which may be included as a part of the wafer carrier illustrated in FIGS. 1 and 2.

FIG. 3 is a partial cross-sectional view of a substrate carrier head 300 which may be included as a part of the substrate carrier 150 illustrated in FIGS. 1 and 2. The substrate carrier head 300 includes a membrane assembly 305 for a chemical mechanical planarization (CMP) system. In some embodiments, the substrate carrier head 300 (also referred to herein as a carrier head) may include a support base 380 to which the membrane assembly 305 is mounted. The support base 380 can be any suitable configuration to provide support to the membrane assembly. The support base 380 can attach and interface the remainder of the substrate carrier head 300 with a CMP system (not shown). The support base 380 can include a carrier body, substrate retainer, a support plate, and/or other components described elsewhere herein to support the wafer (e.g., membrane assembly 305) and/or interface the remainder of the carrier head 300 with a CMP system.

The membrane assembly 305 may include a support plate 310, a resilient membrane 320, a membrane retainer, such as a membrane clamp 330, and an optional outer pressure ring 340, as shown. The support plate 310 can be any suitable configuration to support a wafer during processing, e.g., attach membrane assembly 305 to support base 380. For example, the support plate 310 may be mounted to the support base 380 using one or more bolts or other suitable attachment elements. The support plate 310 may be mounted to the support base 380 at various locations, such as along the outer perimeter of the support base 380.

The support plate 310 can be any suitable configuration to support a wafer, e.g., through the resilient membrane 320. The resilient membrane 320 may be secured to the support plate 310 in a number of different ways. The resilient membrane 320 may be secured to the support plate 310 before or after the support plate 310 is secured to the support base 380. The resilient membrane 320 may be secured to the support plate 310 through use of any of a number of suitable different membrane retainer holding elements, such as the membrane clamp 330. In some embodiments, the membrane clamp 330 may be spring loaded. In other embodiments, the membrane clamp 330 may tighten securely through the use of a fastening mechanism (e.g., nuts and bolts, etc.). The membrane clamp 330 can secure an outer portion (e.g., outer edge) of the membrane 320 to a corresponding portion of the support plate 310 and/or support base 380. The membrane retainer can be any suitable configuration to secure at least a portion of the membrane 320 to the support plate 310 and/or support base 380.

The resilient membrane 320 can be secured to the support plate 310 such that the membrane 320 can hold a substrate 370 against a polishing pad and process the substrate, for example, as described above with reference to FIGS. 1-2. The membrane can include a first surface (e.g., downwardly facing) configured to contact a surface (e.g., upwardly facing) of a substrate. The membrane 320 can be sufficiently resilient and flexible, such that in combination with the polishing pad materials and process parameters, the membrane 320 can apply a more uniform pressure across the entire substrate 370. In some embodiments, the resiliency and flexibility of the membrane 320 may also aid in reducing substrate breakage. The membrane 320 and support plate 310 can be configured to allow a liquid to flow between the membrane 320 and support plate 310, and press the membrane 320 against the substrate 370 during planarization. For example, membrane 320 can be configured to allow a liquid to flow along a second surface, e.g., an upwardly facing surface, opposing the aforementioned first membrane surface. The support plate 310 can be spaced from the membrane 320, to form a gap or membrane cavity 360 therebetween. The membrane cavity 360 can be formed when the membrane 320 is in a quiescent (e.g., non-pressurized) state. The membrane cavity 360 can be sealed. In some embodiments, a liquid tight seal can be formed within the membrane cavity 360 to prevent the liquid from leaking out of the membrane cavity 360 when the liquid is pressurized. Thus, the membrane cavity 360 can form a liquid cavity through which a liquid can be circulated. A seal can be formed between a portion of the membrane 320 and a portion of the carrier body (e.g., plate 310 and/or base 380), for example, at the membrane clamp 330. As used herein, a sealed membrane cavity encompasses a membrane cavity that is in fluid communication with inlet(s) and/or outlet(s) that can be selectively sealed (e.g., opened and closed, for example, with a valve).

In some embodiments, a portion of the membrane 320, such as an upper facing surface thereof, rests upon or is proximate to a corresponding portion of the plate 310, such as a lower facing surface thereof, when the membrane 320 is in a quiescent state, and the membrane cavity 360 is formed when the membrane 320 is expanded (e.g., pressurized via the liquid). The membrane cavity 360 can redistribute and account for variations in the liquid pressure against the membrane 320, and thus, against the substrate 370, during planarization. The liquid can be provided to the backside of the membrane 320 into the membrane cavity 360 through an inlet 350, as shown. The inlet 350 may be disposed within the support plate 310, or can supply liquid through other configurations. The liquid can also be removed from the membrane cavity 360 via an outlet 355. Each of the inlet 350 and the outlet 355 may be modified differently depending on the application (e.g., a circular tube, a square tube, etc.). In some embodiments, vacuum can be provided to the cavity 360 through an inlet and/or outlet, for retaining a wafer 370 to the underside of the membrane assembly, as described further herein.

In some embodiments, the membrane cavity 360 can be formed by spacing the membrane 320 from the support plate 310. For example, the support plate 310 can included a recessed inner portion to form a cavity. In the illustrated embodiment, the membrane assembly 305 can include an optional outer pressure ring 340 to form the membrane cavity 360. In other embodiments, the membrane assembly 305 may be assembled without pressure rings. For example, the resilient membrane 320 may rest directly against the support plate 310 without a membrane cavity 360 separating the membrane 320 from the support plate 310, for example, when no liquid is present in the membrane cavity 360. In some embodiments, the membrane assembly 305 may include one or more pressure rings 340 arranged in concentric circles. The one or more pressure rings 340 may include channels (not illustrated) that allow the liquid to flow from one side of the pressure ring(s) 340 to the other side of the pressure rings 340.

In another embodiment, the wafer carrier can comprise a multi-zone carrier. For example, the membrane 320 may be a multi-zoned membrane. Each zone in a multi-zone membrane can include a corresponding membrane cavity configured to receive a liquid, and/or be similarly (e.g., separately) controlled, as described herein for a single zone carrier with a single zone cavity. For example, the membrane 320 may have grooves (e.g., indentations) and/or raised portions of the membrane 320 that effectively segregate various zones of the membrane 320. In a non-limiting example, the grooves may be arranged in a series of concentric circles originating from the center of the membrane. In another example, the grooves and raise portions may be irregularly shaped (e.g., interconnecting circles, non-circular indentations, circular patterns scattered across the surface of the membrane) in order to improve distribution of pressure applied across the substrate 370 when attached to the membrane assembly 305. In some embodiments, the system may apply different pressures to one or more of the zones in a multi-zoned membrane to tune the removal rate in each of the zones. For example, the rate of removal may be higher for a zone in which higher pressure is applied. The system may also be able to adjust the temperature of the liquid provided to one or more of the zones to adjust the removal rate. For example, a higher temperature (e.g., less cooling) may be applied to a particular zone to increase the removal rate compared to another zone. The effect of changes in temperature on removal rate may be relatively lower than the effect of changes in pressure. Thus, temperature may be used as a fine tuning variable when adjusting the removal rate for a single or multi-zone system. For example, the pressure of a first zone can be controlled to be the same, greater than, or less than, the pressure of a second zone. The temperature of a first zone can be controlled to be the same, greater than, or less than, the temperature of a second zone.

The membrane 320 may be flexible such that it conforms to a structure that it surrounds. In some instances, the membrane 320 may be convex. For example, the membrane 320 may sag in the center. The membrane 320 may even be shaped like a cone such that a small area of the membrane 320 would be in contact with the substrate surface for finer precision polishing.

The membrane material may be any resilient material suitable for planarization, as described herein, and for use, for example, within a carrier head for a CMP process. In some embodiments, the membrane material may be one of rubber or a synthetic rubber material. The membrane material may also be one of Ethylene propylene diene monomer (M-class) (EPDM) rubber or silicone. Alternatively, it may be one or more combinations of vinyl, rubber, silicone rubber, synthetic rubber, nitrile, thermoplastic elastomer, fluorelastomers, hydrated acrylonitrile butadiene rubber, or urethane and polyurethane formas. In order to effectively cool (or heat, or otherwise control temperature of) the substrate, in certain embodiments, the material for the resilient membrane 320 may be selected based on the material's heat transfer properties. Thus, materials having higher thermal conductivity may be desirable when cooling a substrate, such as a silicon carbine substrate. For example, in some embodiments, the membrane material may be an elastomer, such as silicone, including those available under the trademark Arlon® owned by Rogers Corporation, which have thermal conductivities that can aid in cooling a substrate. In some embodiments, the resilient membrane 320 may include inorganic additives that increase the thermal conductivity of the resilient membrane 320 to improve the heat transfer between the temperature control liquid and the substrate. Examples of inorganic additives that increase thermal conductivity may include the series of additives manufactured under the trademark Martoxid®, owned by Martinswerk GMBH.

One or more membrane assemblies can be implemented within a single CMP system. The CMP system may have controls utilizing feedback from the system while operating to more accurately control the CMP process (e.g., variable speed motor controls, etc.).

In an exemplary embodiment, the membrane 320 may be planarized. For example, the membrane 320 can be made flat within a desired tolerance, and/or made to conform to a surface roughness within a desired tolerance. For example, the membrane 320 may undergo a planarization procedure wherein the membrane is subjected to a polishing pad. In addition, the membrane 320 may be introduced to a chemical slurry that causes the membrane 320 to become planarized. Furthermore, the surface roughness of the membrane 320 can be improved throughout this planarization process.

Surface roughness can be important for membranes used within the context of a CMP process for at least two reasons: sealing and stiction. Through the planarization process, the surface roughness may be lowered in order to provide improved sealing between the substrate 370 and the membrane 320 for handling purposes. At the same time, the surface roughness may be increased in order to prevent stiction (i.e., the substrate sticking to the membrane from surface tension), and improve substrate release from the membrane after processing. Control mechanisms may be used during the planarization process (described below) in order to achieve a desired balance between low and high surface roughness. The control mechanism may be external to the device used to planarized the membrane.

Figure 4A:
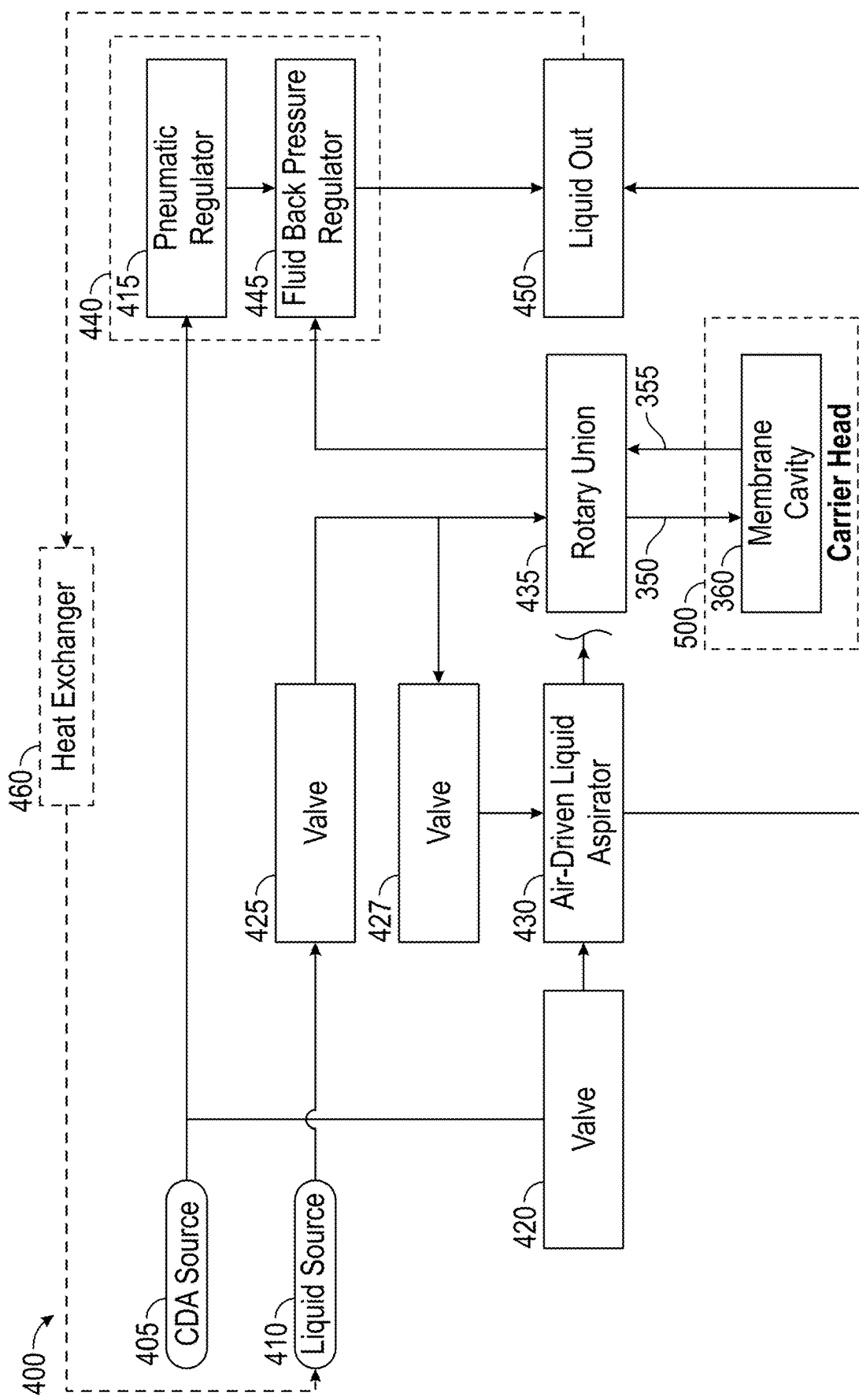
FIG. 4A is a block diagram illustrating a substrate carrier system that can be used to control the temperature of a wafer in accordance with aspects of this disclosure.

As discussed above, when polishing substrates at higher pressures and/or speeds, which may be relevant for certain substrates such as silicon carbide substrates, the friction between the substrate and the rotating polishing pad/platen may result in a temperature that is high enough to negatively affect the substrate 370 and/or resilient membrane 360. Thus, one aspect of this disclosure relates to flowing a liquid along a surface of the resilient membrane 360 in order to cool the resilient membrane 360 and the substrate 370. FIG. 4A is a block diagram illustrating a substrate carrier system 400 that can be used to control the temperature of a substrate in accordance with aspects of this disclosure.

With reference to FIG. 4A, the substrate carrier system 400 can include a gas source, such as a compressed dry air (CDA) source 405, and a liquid source 410. The gas source and liquid source can be provided via facilities, an on-site container, and/or can be part of a recirculating system described herein. System 400 can include one or more valves to provide selective vacuum, gas or liquid flow, such as valves 420, 425, and 427. System 400 can include a vacuum source, such as an air-driven aspirator 430. System 400 can include a carrier head 500 with a membrane cavity 360, inlet 350, and outlet 355, similar to those described herein with respect to carrier head 300 (FIGS. 3 and 5), carrier head 600 (FIGS. 6-8), or other carrier heads which provide temperature control as describe herein. System 400 can include a moveable element configured to provide relative movement between a carrier head and a polish head, such as a rotary union 435. The rotary union 435 can be a part of the carrier head or a separate component mounted thereto. System 400 can include a control system 440. The control system 440 may include pressure and/or flow regulators configured to control pressure and/or flow within the membrane cavity 360, at the inlet and/or outlet thereto. For example, the control system 440 can include a fluid back pressure regulator 445, and in some embodiments, a pneumatic regulator 415. In some embodiments, the control system 440 may further include a control processor (not illustrated) configured to control one or more of the pneumatic regulator 415, the fluid back pressure regulator 445, and/or other components of the substrate carrier system 400. It will be understood that the control system 440 can include one or more sensors configured to sense various process parameters, such as flow rate, pressure, temperature, etc., to provide open or closed loop control, with a control processor. For example, a temperature, flow, and/or pressure sensor can be implemented to sense the temperature, flow, and/or pressure sensor of the liquid in fluid communication with the membrane cavity.

The liquid used for cooling may be selected at least in part based on the liquid's heat transfer properties. In one embodiment, the liquid may be water. In another embodiment, the liquid may be designed to have higher heat transfer properties than water, for example, the liquid may be a Galden HT heat transfer fluid. Other liquids may also be used depending on the embodiment.

The liquid source 410 selectively provides liquid to the membrane cavity 360 (e.g., through the rotary union 435 via the valve 425). The rotary union may have a set of fluid channels that allows the liquid source 410 to provide liquid to the inlet 350 of the carrier head 500 and receive liquid flowing out of the substrate carrier head 300 via the outlet 355, while enabling the carrier head 500 to rotate. The liquid received from the liquid source is allowed to flow into the membrane cavity 360 via the inlet 350 and is allowed to flow out of the membrane cavity 360, e.g., to the fluid back pressure regulator 445, via the outlet 355.

The CDA source 405 provides CDA to the pneumatic regulator 415 such that the pneumatic regulator 415 can control the fluid back pressure regulator 445. In some embodiments, the fluid back pressure regulator 445 can be controlled directly from a control processor, without the inclusion of the pneumatic regulator 415. The fluid back pressure regulator 445 controls the pressure of the liquid within the membrane cavity 360 by maintaining a desired pressure of the liquid upstream of the fluid back pressure regulator 445. Thus, the fluid back pressure regulator 445 may relieve excess pressure when the liquid pressure is higher than a desired pressure by allowing a portion of the liquid to flow out into a liquid out port 450. The liquid out port 450 can comprise a tee connection, or a valve to provide selective flow between the regulator 445, the aspirator 430, and/or an optional heat exchanger 460. The fluid back pressure regulator 445 may be configured to control the pressure of the liquid in the membrane cavity 360, and thus, the pressure applied to the substrate during CMP. The pressure of the liquid provided by the liquid source may be higher than the range of pressures expected to be applied to the substrate 370 during CMP. Thus, the fluid back pressure regulator 445 can be configured to adjust the pressure of the liquid in the membrane cavity 360 by relieving the pressure of the fluid down to the desired level. The pressure within the membrane 360 can be controlled via an additional or alternative pressure regulator positioned upstream of the membrane cavity 360.

The CDA source 405 also provides CDA to the air-driven liquid aspirator 430 via the valve 420. The valve 427 can be used to control the manner in which the liquid is provided to the membrane cavity 360 between: allowing the liquid to flow, providing negative pressure (e.g., via the air-driven aspirator 430), and venting of the membrane cavity 360. When providing negative pressure, the air-driven liquid aspirator 430 is configured to provide negative pressure (e.g., a vacuum) to the liquid in the membrane cavity 360. In certain embodiments, the air-driven liquid aspirator 430 may also include an exhaust for the CDA, where the flow of the CDA through the air-driven liquid aspirator 430 controls the negative pressure provided to the liquid. The negative pressure can be used to provide suction between the resilient membrane and the substrate 370, allowing the substrate carrier head 300 to pick up the substrate for handling functionality. That is, the negative pressure provided by the air-drive liquid aspirator 430 can retain the substrate 370 at the underside of the resilient membrane 320. The support plate providing support at the backside of the resilient membrane 320 may include holes to provide the above-described vacuum (to provide a suction cup effect on the wafer) and/or allow for positive pressure of the liquid in the membrane cavity 360 to disengage the substrate 370 from the resilient membrane 320.

In some embodiments, excess liquid flowing out of the liquid out port 450 may simply be discarded to form a non-recirculating system. However, in other embodiments, excess liquid flowing out of the liquid out port 450 may be recirculated back to the liquid source 410. In certain implementations, the system 400 may further include an optional heat exchanger 460 configured to adjust the temperature of (e.g., cool) the liquid before providing the liquid back to the liquid source 410 and into the carrier head.

Figure 4B:
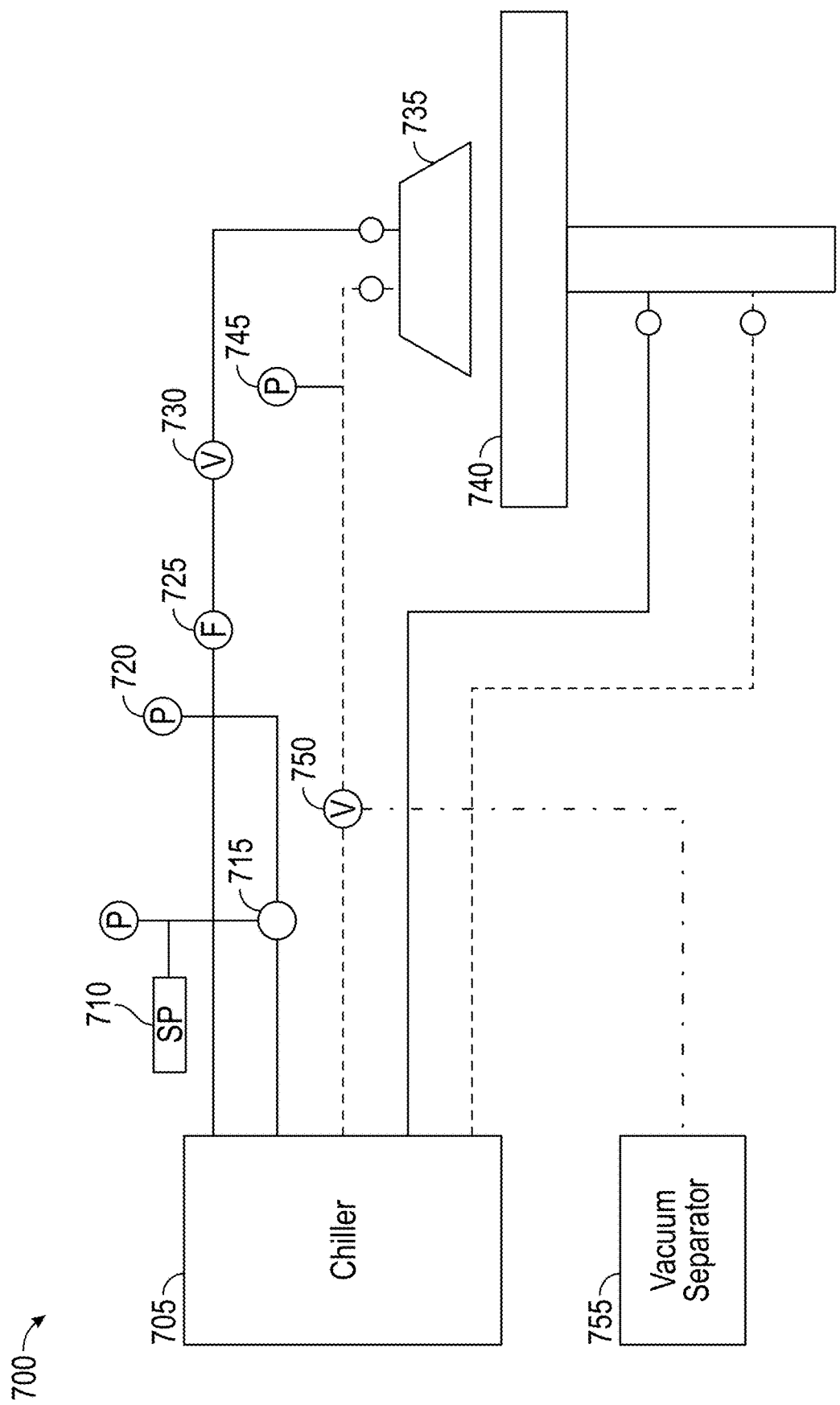
FIG. 4B is a block diagram illustrating another substrate carrier system that can be used to control the temperature of a wafer in accordance with aspects of this disclosure.

FIG. 4B is a block diagram illustrating another substrate carrier system that can be used to control the temperature of a wafer in accordance with aspects of this disclosure. With reference to FIG. 4B, the substrate carrier system 700 can include a chiller 705, a pressure setpoint 710, a back pressure regulator (BPR) 715, an input pressure gauge 720, a flow gauge 725, a water "on" valve 730, a carrier 735 (such as the carrier head 300 or 600), a platen 740, an output pressure gauge 745, a recirculation/vacuum valve 750, and a vacuum separator 755.

In the embodiment of FIG. 4B, the back pressure regulator (BPR) 715 is located upstream of the carrier 735. This configuration can provide higher flow rates than a configuration in which the BPR 715 is located downstream from the carrier 735. The higher flow rates can improve cooling of the substrate via the resilient membrane. A similar positioning of the fluid back pressure regulator 445 to the upstream side of the carrier head 500 can be implemented within the embodiment of FIG. 4A.

With reference to FIGS. 3, 4A, and 4B, as the liquid is flowed through the membrane cavity 360 along the backside of the resilient membrane 320, heat generated due to the friction of the polishing process is transferred from the substrate 370 into the liquid via the resilient membrane 320. The substrate carrier system 400 may control the liquid to have a flow-rate sufficient along the resilient membrane 320 to remove excess heat generated during the polishing process. For example, a liquid flow controller (e.g., the control system 440) can be implemented upstream or downstream of the membrane cavity 360.

The inlets and outlets can be configured in many different ways, to affect the liquid flow (and thus temperature control) within the membrane cavity. In the embodiment of FIG. 3, the inlet 350 may be located at approximately the center of the body of the substrate carrier head 300 and the outlet 355 may be located at a farther radial position from the center of the carrier body than the inlet 350, for example, near an outer circumferential edge of the resilient membrane 320. The rotation of the substrate carrier head 300 during polishing may aid the flow of the liquid from the inlet 350 to the outlet 355 due to centripetal force. Although a single inlet 350 and a single outlet 355 are illustrated in FIG. 3, a plurality of inlets 350 and/or outlets may be included in some embodiments. For example, a plurality of outlets 355 may be positioned near the outer circumferential edge of the resilient membrane 320 and/or at intervals along a radial (or circumferential) path extending from the center of the carrier body.

Figure 5:
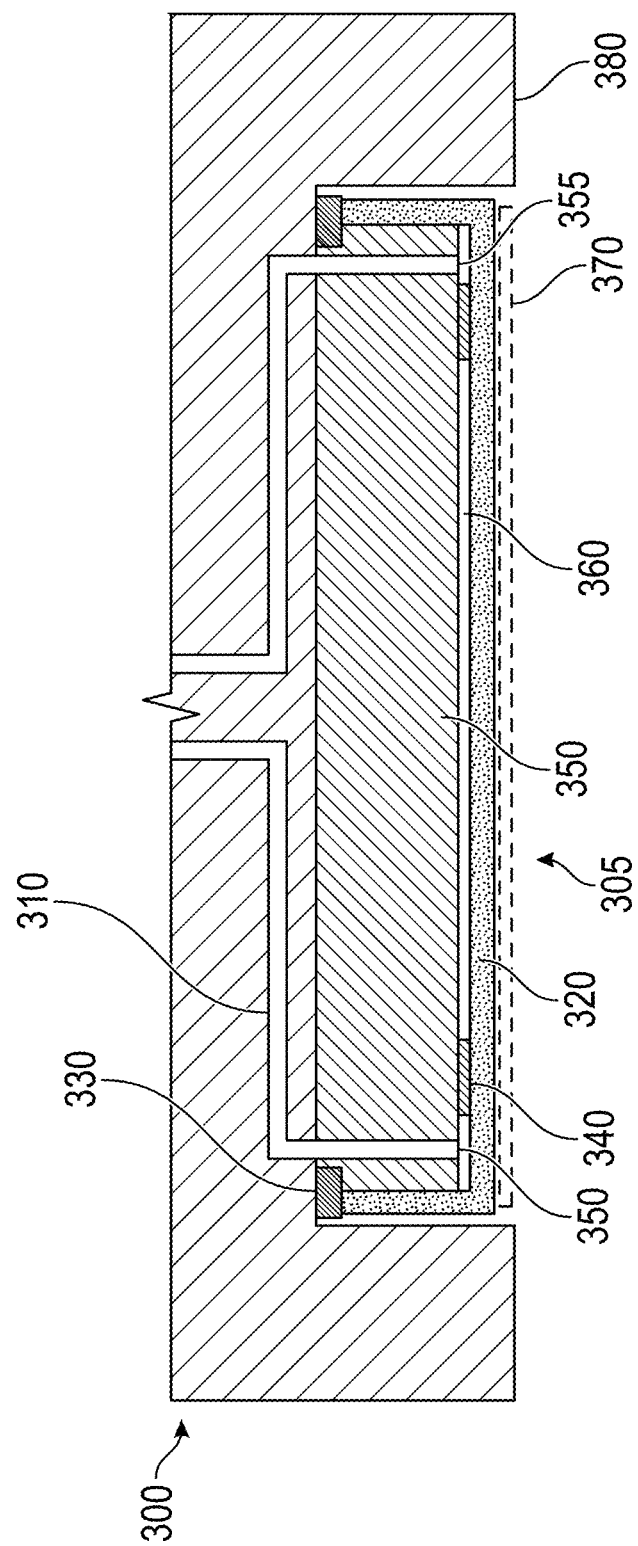
FIG. 5 is another partial cross-sectional view of a substrate carrier head which may be included as a part of the wafer carrier illustrates in FIGS. 1 and 2 according to another embodiment.

FIG. 5 is another partial cross-sectional view of a substrate carrier head 300 which may be included as a part of the substrate carrier 150 illustrates in FIGS. 1 and 2 according to another embodiment. Similar to the embodiment of FIG. 3, the substrate carrier head 300 of the FIG. 5 embodiment includes a membrane assembly 305, an inlet 350, and outlet 355, a membrane cavity 360, and a support base 380. The membrane assembly 305 may include a support plate 310, a resilient membrane 320, a membrane clamp 330, and an optional outer pressure ring 340. The membrane assembly 305 may be configured to hold a substrate 370 against a polishing pad during planarization and provide a vacuum for retaining the substrate 370 to the underside of the membrane assembly 305. These components may have a similar functionality to that described in connection with FIG. 3.

As shown in FIG. 5, the inlet 350 and the outlet 355 may be located at opposing positions, for example, near an outer circumferential edge of the resilient membrane 320. Thus, the liquid flowing from the inlet 350 may flow from one side (e.g., edge) of the resilient membrane 320 to the outlet 355 located at the opposing side (e.g., edge) of the resilient membrane 320.

It will be understood that the inlet(s) 350 and outlet(s) 355 described herein can be provided in any suitable configuration (e.g., shape, size, position, quantity, etc.) to improve temperature control and liquid distribution. For example, although a single inlet 350 and outlet 355 are shown in the cross-section of FIGS. 3 and 5, two or more inlets 350 and two or more outlets 355 may be provided. The one or more inlets or one or more outlets can be provided at various positions on opposing sides of the resilient membrane 320 (e.g., near the outer circumferential edge) such that the liquid flows more evenly along the resilient membrane 320. In some embodiments, one or more inlets 350 can be positioned radially inwardly relative to one or more outlets 355, and vice versa, with respect to the center of the resilient membrane 320. In some embodiments, one or more inlets 350 can be positioned at approximately the same radial position, but a different circumferential position, relative to one or more outlets 355. The one or more inlets 350 or the one or more outlets 355 can be positioned at the approximate center of the resilient membrane 320.

Multi-Membrane CMP System with Liquid Cooling

Figure 6:
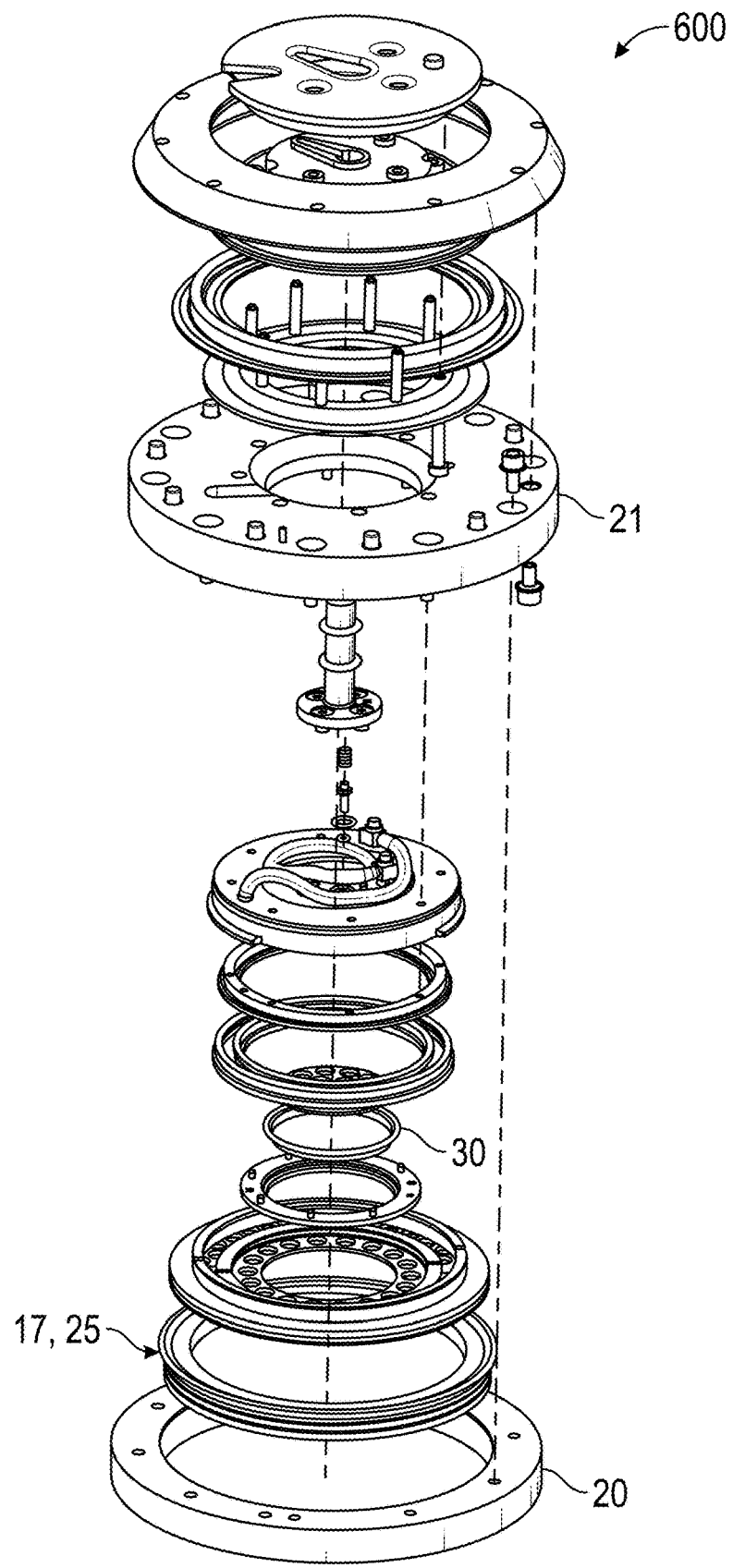
FIG. 6 is an exploded top isometric view of an embodiment of a substrate carrier head in accordance with aspects of this disclosure.
Figure 7:
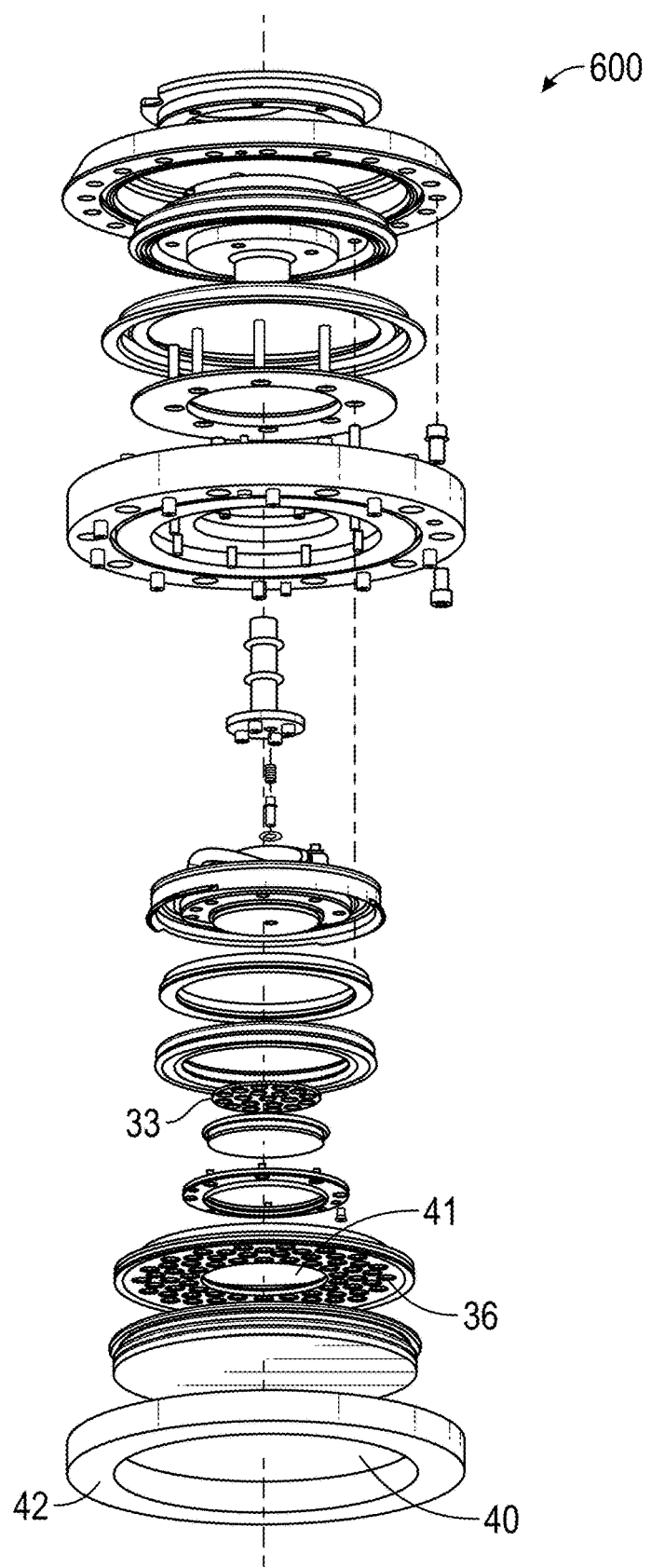
FIG. 7 is an exploded bottom isometric view of the carrier head in FIG. 6 in accordance with aspects of this disclosure.
Figure 8:
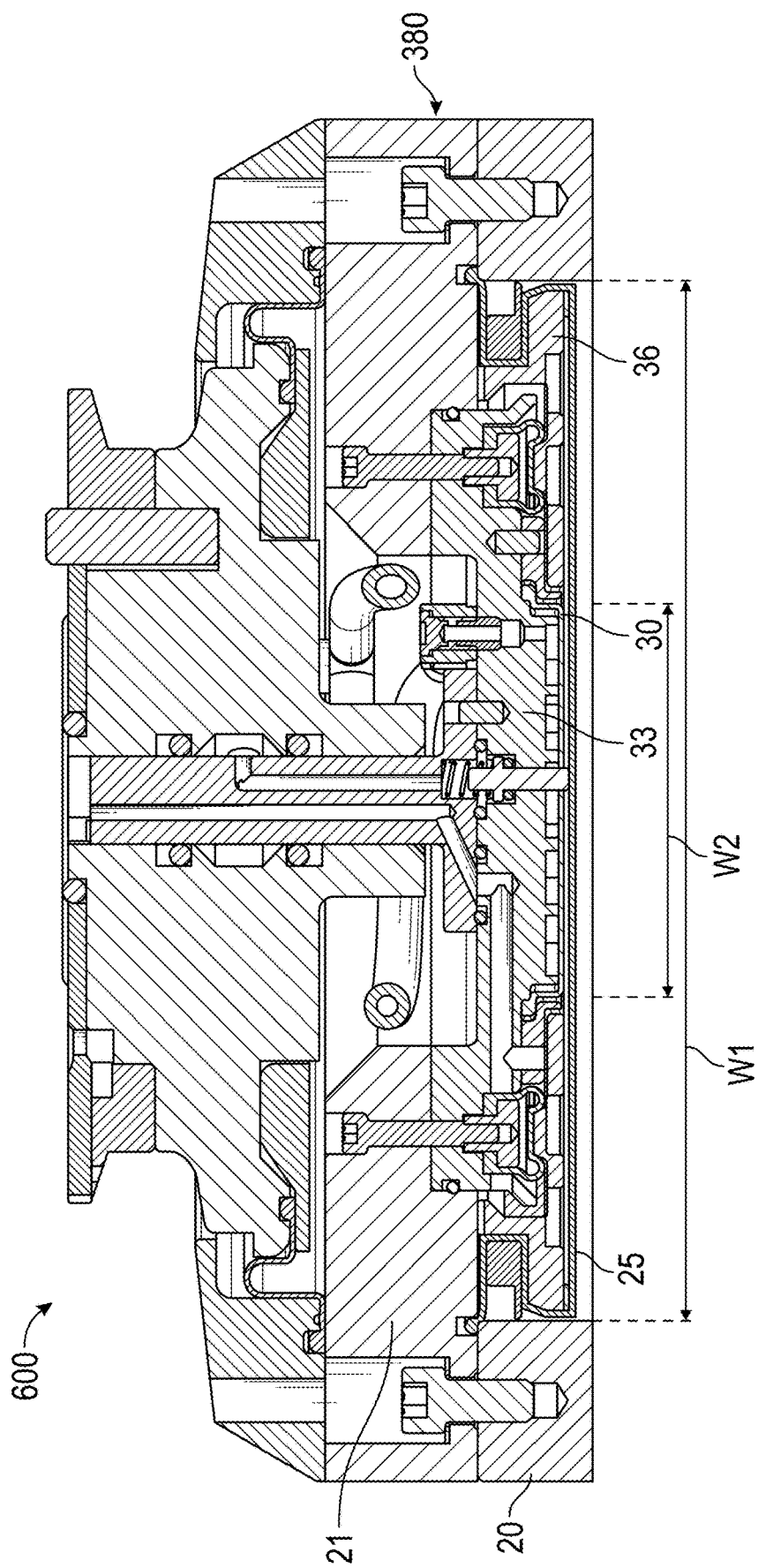
FIG. 8 is a cross-sectional view of the carrier head in FIG. 6 in accordance with aspects of this disclosure.

FIG. 6 is an exploded top isometric view of an embodiment of a substrate carrier head 600. FIG. 7 is an exploded bottom isometric view of the carrier head 600 in FIG. 6. FIG. 8 is a cross-sectional view of the carrier head 600 in FIG. 6. Embodiments of carrier head 600 can be implemented within various types of substrate processing apparatus. For example, the carrier head 600 can be implemented in CMP systems, such as those described with reference to FIGS. 1 and 2, or other types of CMP systems. Carrier head 600 can be implemented within the substrate carrier system of FIG. 4A, and can include some features of the carrier heads in FIGS. 3 and 5 (and vice-versa).

With reference to one or more of FIGS. 6-8, the substrate carrier head 600 can include a carrier body 21 to support various components of the carrier head 600. The carrier head can include a substrate retainer 20 attached to the carrier body 21. The retainer 20 can be configured to retain and support a substrate on the carrier head 600. For example, the substrate retainer can include an aperture 40 configured to receive a substrate. The aperture 40 can form sidewalls extending partially or completely through the thickness of the substrate retainer to support, and thus prevent lateral movement, of a substrate held within aperture 40. The retainer 20 can be a separate or integrally formed piece and can be the same or different material, with respect to the carrier body 21. The substrate retainer can include a substantially unbroken outer surface 42, or the surface can have grooves or other recesses to improve slurry flow.

The carrier head 600 can include a first resilient membrane 25 and a second resilient membrane 30. The membranes, or portions thereof, can be stacked or positioned adjacent to each other, for example without intervening structure. The membranes 25, 30 can together press a substrate against a substrate processing platen during substrate processing, as described above with respect to CMP processing in FIGS. 1 and 2. Portions of membranes 25, 30 can press against each other.

The membranes 25, 30 may be flexible such that each conforms to an adjacent structure. The membrane material may be any resilient material, for example, material suitable for receiving a back pressure, and transferring that back pressure against a substrate held within a carrier head. In some embodiments, the membrane material may be one of rubber or a synthetic rubber material. As described above, the membrane material may also be one of Ethylene propylene diene monomer (M-class) (EPDM) rubber or silicone. Alternatively, it may be one or more combinations of vinyl, rubber, silicone rubber, synthetic rubber, nitrile, thermoplastic elastomer, fluorelastomers, hydrated acrylonitrile butadiene rubber, or urethane and polyurethane formas. In order to effectively cool the substrate, in certain embodiments, the material for the resilient membranes 25, 30 may be selected based on the material's heat transfer properties. Thus, materials having higher heat conductivity may be desirable when cooling a substrate, such as a silicon carbine substrate. In some embodiments, the resilient membranes 25, 30 may include inorganic additives that increase the thermal conductivity of the resilient membranes 25, 30 to improve the heat transfer between the temperature control liquid and the substrate.

The membranes 25, 30 (and other membranes herein) can include portions that provide support to a substrate held within carrier 600 (and other carriers herein). Such substrate support portions can be distinguished from other portions of the membranes 25, 30 which do not support the substrate, but assist in attaching the membranes 25, 30 to other portions of the carrier.

For example, the first resilient membrane 25 can include a first substrate support portion with a width W1 as shown. The first substrate support portion as shown is the horizontal portion of first membrane 25 which extends and provides support across its width W1 to a substrate held within the aperture 40 of the substrate retainer 20. The remainder of the first resilient membrane 25 (i.e., the portions that are not the first substrate support portion), which can include, for example, the shorter vertical and horizontal portions wrapping in a serpentine shape around and/or between an outer portion of an outer support plate 36 (described further below), a membrane backing support 17, the substrate retainer 20 and the carrier body 21, can be configured to provide attachment of the first membrane 25 to the rest of the carrier head 600.

The second resilient membrane 30 can include a second substrate support portion with a width W2. The second substrate support portion as shown is the horizontal portion of second membrane 30 which extends and provides support across its width W2 to an inner, central portion of a substrate held within the aperture 40 of the substrate retainer 20. The second substrate support portion can be positioned between the first substrate support portion and the carrier body 21. The first and second substrate support portions can be stacked with respect to each other, and can be stacked directly on each other (i.e., contacting each other). The second substrate portion can be stacked above the first substrate portion, in the orientation shown. The second substrate support portion can be configured to selectively provide a force against an inner section of the first imperforated substrate support portion as shown. An outer surface of the second substrate support portion can directly contact an inner surface of at least the inner section of the first substrate support portion. This configuration can allow the second membrane 30 to provide improved process and uniformity on a substrate, for example, to provide improved center removal rate control in a CMP process.

The remainder of the second resilient membrane 30 (relative to the second substrate support portion), which can include, for example, the short vertical portion at its outer edges, and the horizontal lip extending from the distal end of the vertical portion, can be configured to provide attachment of the second membrane 30 to the rest of the carrier head 600.

The membranes 25, 30 (or other membranes herein) can each include imperforated portion(s), or the membranes 25, 30 can each be substantially entirely imperforated. For example, a membrane is "substantially entirely imperforated" when there are no holes extending through any surface that is in fluid communication with a corresponding sealed membrane cavity. Thus, a membrane that has holes, for example, at its peripheral edge for mounting purposes, but which are fluidly isolated (e.g., sealed) from a membrane cavity, can be "substantially entirely imperforated." The membranes 25, 30, or sections thereof, can be imperforated, to provide a sealed cavity, while allowing for expansion and contraction of the membranes using liquid pressure or vacuum, during processing, without liquid leakage. The first and second substrate support portions can each be imperforated to form a first imperforated substrate support portion, and a second imperforated substrate support portion, respectively.

The carrier head can include an inner support plate 33. The inner support plate can be fixed, to prevent relative motion, once assembled, relative to the carrier body 21. The inner support plate 33 can include a generally planar, rigid support surface configured to support a substrate held upon the second substrate support portion of the second membrane 30 during processing.

The carrier can include an outer support plate 36. The outer support plate 36 can include a generally planar, rigid support surface configured to support a substrate held upon the first substrate support portion of the first membrane 25. In some embodiments, the outer support plate 36 can support a section of the first substrate support portion of the first membrane 25. For example, the outer support plate 36 can include a central opening 41 surrounded by an outer plate portion which can support a corresponding outer section of the first substrate support portion of the second membrane 30 during processing. The central opening 41 can be configured to surround the second substrate support portion. In some embodiments, the width W1 of the first substrate support portion can be greater than the width W2 of the second substrate support portion. In some embodiments, the outer support plate 36, first membrane 25, and second membrane 30 can be configured such that the second substrate support portion can pass through the central opening 41 of the outer support plate 36. Thus, in some embodiments, the inner support plate 33 can support an inner portion of a substrate held upon the carrier 600, and the outer support plate 36 can support an outer portion of a substrate held upon the carrier 600, during processing.

The membranes herein may be single, or multi-zoned membranes. For example, the membranes may have grooves (e.g., indentations) and/or raised portions that effectively segregate various zones within each of the membranes. In a non-limiting example, the grooves may be arranged in a series of concentric circles originating from the center of the membrane. In another example, the grooves and raised portions may be irregularly shaped (e.g., interconnecting circles, non-circular indentations, circular patterns scattered across the surface of the membrane) in order to improve distribution of pressure applied across the substrate during processing. In some embodiments, the zones can be used for controlling or adjusting the material removal rate in different regions of the substrate by applying the temperature controlled liquid to one or more associated zones in the resilient membrane(s).

In some embodiments, either or both membranes can be a single zone membrane wherein each zone is configured to receive pressure or vacuum from only a single cavity on the backside of each membrane. "Single cavity" is defined as a single volume in common fluid communication, and not be limited to a particular shape. The cavity can comprise a small volume in common fluid communication, which is formed between relatively small tolerances between components, without being readily viewable on FIG. 8. For example, carrier 600 can include a single first membrane cavity formed within relatively small open spaces between the first substrate support portion of the first membrane 25 and portions of the carrier body 21 and/or the outer support plate 36. The first membrane cavity can provide fluid communication from a liquid source 410 to the backside of the first substrate support portion of the first membrane 25. Thus, by flowing a temperature control liquid along the backside of the first membrane 25, the substrate and the first membrane 25 can be cooling during a CMP process.

In some embodiments, carrier 600 can include a single second membrane cavity formed, for example, between the second substrate support portion of the second membrane 30 and the inner support plate 33. The second membrane cavity may be fluidly isolated from the first membrane cavity such that the liquid does not leak from the first membrane cavity into the second membrane cavity. The first cavity can increase in volume upon pressurization of the liquid in the first membrane 25 via, for example, a fluid back pressure regulator 445. The second membrane cavity can increase in volume upon pressurization of the corresponding second membrane 30 with CDA.

In some embodiments, the bottom surface of the second membrane 30 and/or the top surface of the first membrane 25 can include a texture and/or liquid flow channels. The texture and/or liquid flow channels may allow the liquid to flow between the first and second membranes 25, 30 allowing the liquid to cool the area of the substrate overlapping the second membrane 30.

Comparative Examples for Silicon Substrates and Silicon Carbide Substrates

Due to the differences between silicon substrates and silicon carbide substrates, a number of the parameters associated with a CMP process performed on each type of process may be different. These variations in the parameters may result in excess heat being generated for silicon carbide CMP, for which aspects of this disclosure are designed to cool. Table 1 below summarizes examples values for typical silicon substrate and silicon carbine substrate CMP processes.

TABLE 1

| Parameter | Typical material (silicon) | Silicon Carbide |
|---|---|---|
| Carrier Head Rotation speed (rpm) | 50-100 | 50-200 |
| Substrate pressure (psi) | 2-6 | 5-15 |
| Substrate/pad temperature (deg. F., without cooling) | Ambient | >=100+ |
| Material removal rate (um/hour) | 50-100 | 5-10 |

TABLE 1-continued

| Parameter | Typical material (silicon) | Silicon Carbide |
|---|---|---|
| Substrate thickness (um) | 600-800 | 350 |
| Slurry flow rate (ml/min) | 100-200 | 50 |
| Material Hardness (Mohs scale) | 7 | 9-9.5 |

The parameters used for CMP of a silicon carbide substrate may vary depending on the particular implementation. In some implementations, during the processing of a silicon carbide substrate, the substrate carrier head may rotate at a speed greater than the typical range of rotation speeds used for silicon. For example, for polishing a silicon carbide substrate, the substrate carrier head may rotate at a speed greater than approximately 100 rpm, greater than approximately 110 rpm, greater than approximately 125 rpm, greater than approximately 150 rpm, or greater than approximately 175 rpm, up to a speed of approximately 200 rpm, or any range therebetween.

The pressure applied to the substrate may also exceed typical ranges for silicon carbide substrate polishing compared to silicon substrate polishing. Here, for example, for polishing a silicon carbide substrate, the control system 440 may control the liquid pressure to a pressure above approximately 6 psi, or to a pressure above approximately 7 psi, or to a pressure above approximately 8 psi, or to a pressure above approximately 9 psi, or to a pressure above approximately 10 psi, or to a pressure above approximately 11 psi, or to a pressure above approximately 12 psi, or to a pressure above approximately 13 psi, or to a pressure above approximately 14 psi, up to a pressure of approximately 15 psi, or any range therebetween.

During the typical polishing of a silicon substrate, the temperature may not rise substantially above or below the ambient temperature (e.g., room temperature) of the environment. However, without the use of any active temperature control (e.g., cooling) of a silicon carbide substrate, the temperature of the silicon carbide substrate and the polishing pad may rise above approximately 100° F. By cooling a substrate (e.g., a silicon carbide substrate) in accordance with aspects of this disclosure, the temperature of the substrate and the polishing pad may be decreased, relative to the temperature of processes that would otherwise occur without active temperature control, by more than approximately 10° F., 20° F., 30° F., 40° F., 50° F., 60° F., 70° F., 80° F., 90° F., up to 100° F., or any range therebetween. As mentioned elsewhere, it is anticipated that temperature control to increase temperatures during some processes may be advantageous, as well as decrease temperatures, or maintain temperatures at a desired target. Thus, in some embodiments, the temperature of a CMP process can be controlled to within (i.e., plus or minus) 0° F., 10° F., 20° F., 30° F., 40° F., 50° F., 60° F., 70° F., 80° F., 90° F., or 100° F. of the desired target temperature, or any range therebetween.

Embodiments herein can allow for processing of substrates of reduced thickness. For example, silicon carbide substrates may also have a thickness that is less than the typical silicon substrate thickness of approximately 600-800 μm. For example, the silicon carbide substrate may have a thickness of less than approximately 600 μm, less than approximately 500 μm, less than approximately 450 μm, less than approximately 400 μm, down to a thickness of approximately 350 μm, or any range therebetween, or in some embodiments, a thickness of approximately 350 μm.

The polishing of a silicon carbide substrate using embodiments herein may also allow for use a lower material removal rate than the typical rate for silicon substrates. For example, the material removal rate that may be implemented on a silicon carbide substrate can be less than approximately 50 μm/hour, 40 μm/hour, 30 μm/hour, 20 μm/hour, 10 μm/hour, and as low as 5 μm/hour and any range therebetween.

The polishing of a silicon carbide substrate using embodiments herein may also allow for use a lower slurry flow rate than the typical rate for silicon substrate polishing of 100-200 ml/min. For example, the slurry delivery system 140 may deliver processing slurry to the silicon carbide substrate at a rate of less than approximately 100 ml/min, less than approximately 90 ml/min, less than approximately 75 ml/min, less than approximately 60 ml/min, down to approximately 50 ml/min, or any range therebetween.

As used herein, the "silicon" with respect to "silicon wafers" or "silicon substrates" refers to the conventional materials used in forming silicon wafers, which is typically a highly pure, single crystalline material. Embodiments herein can allow for processing of substrates of greater hardness than conventional silicon substrates, such as silicon carbide substrates. For example, a substrate can be included and processed with reduced breakage, with a hardness (Mohs scale) greater than approximately 7, 7.5, 8, 8.5, 9, 9.5, 10, 10.5, 11 and any range therebetween. In some embodiments, substrates can be processed that have a hardness (Mohs scale) greater than approximately 11. In some embodiments, substrates can be processed that have a hardness (Mohs scale) between approximately 8.5-10, or 9-9.5. Substrates that have a hardness greater than the hardness of silicon in a silicon substrate can be processed. Substrates that are not silicon in a silicon substrate can be processed. In some embodiments, a silicon substrate can be included, to provide temperature control of the process. Additionally, substrates other than silicon or silicon carbide substrates can be implemented.

CMP System with Liquid Cooling Having a Rigid Wafer Support Plate

Figure 9:
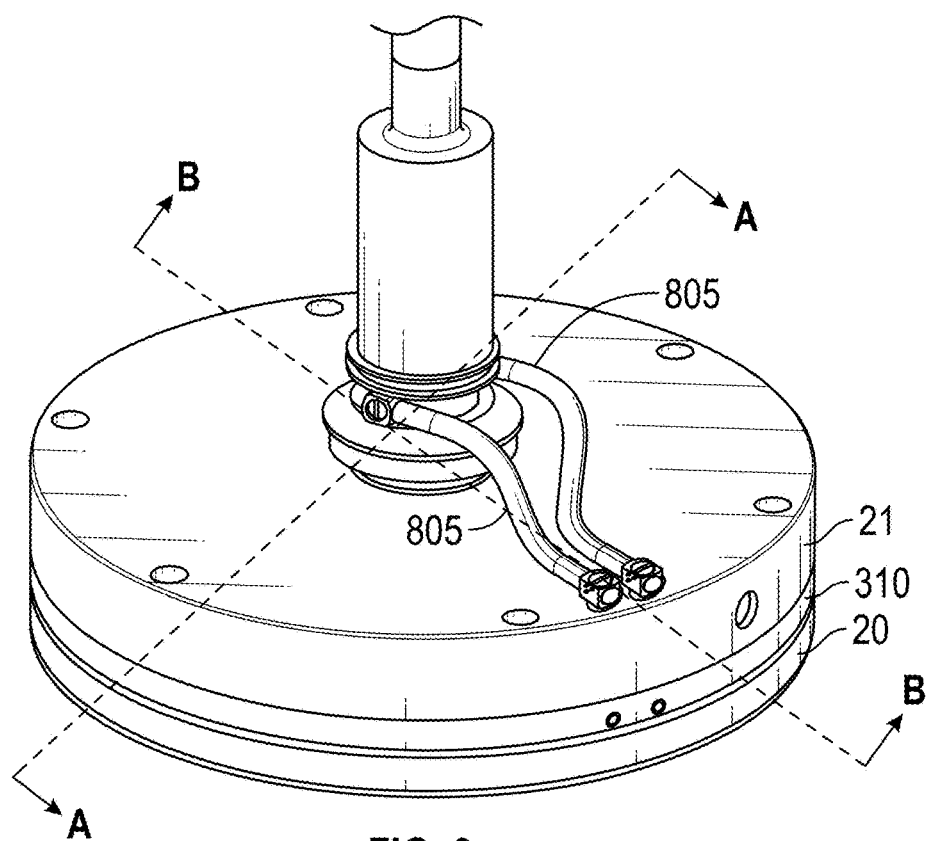
FIG. 9 is a perspective view of another embodiment of a substrate carrier that can be used as part of a substrate carrier system to control the temperature of a substrate in accordance with aspects of this disclosure.
Figure 10:
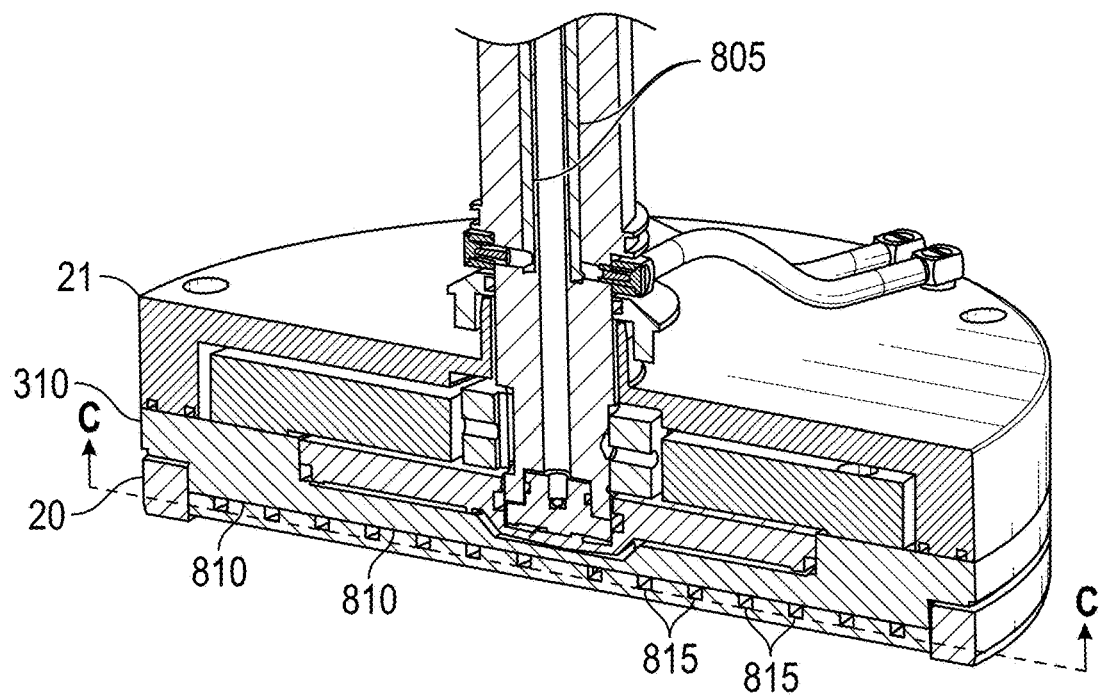
FIG. 10 is a cross-sectional view of the substrate carrier of FIG. 9 taken along line A-A of FIG. 9.
Figure 11:
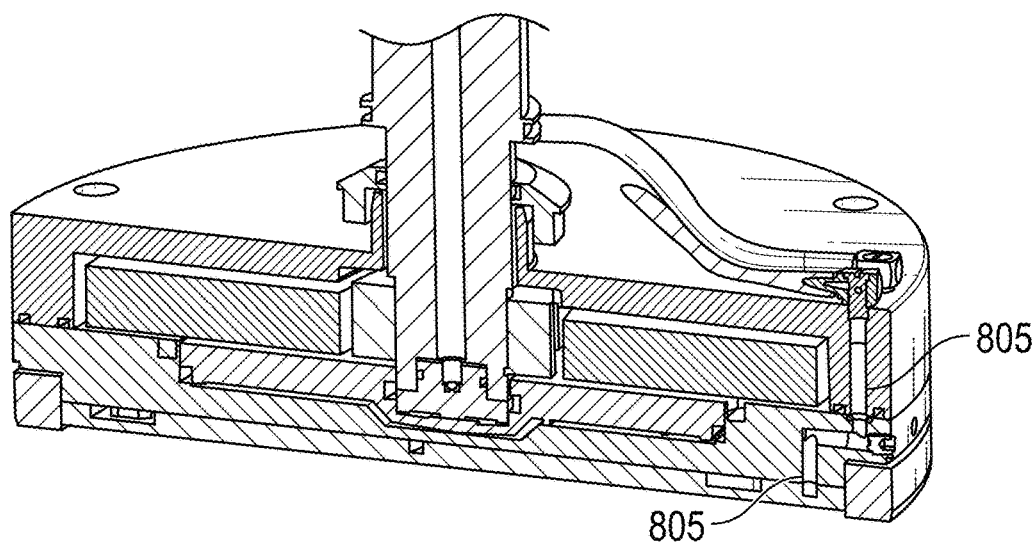
FIG. 11 is another cross-sectional view of the substrate carrier of FIG. 9 taken along line B-B of FIG. 9.
Figure 12:
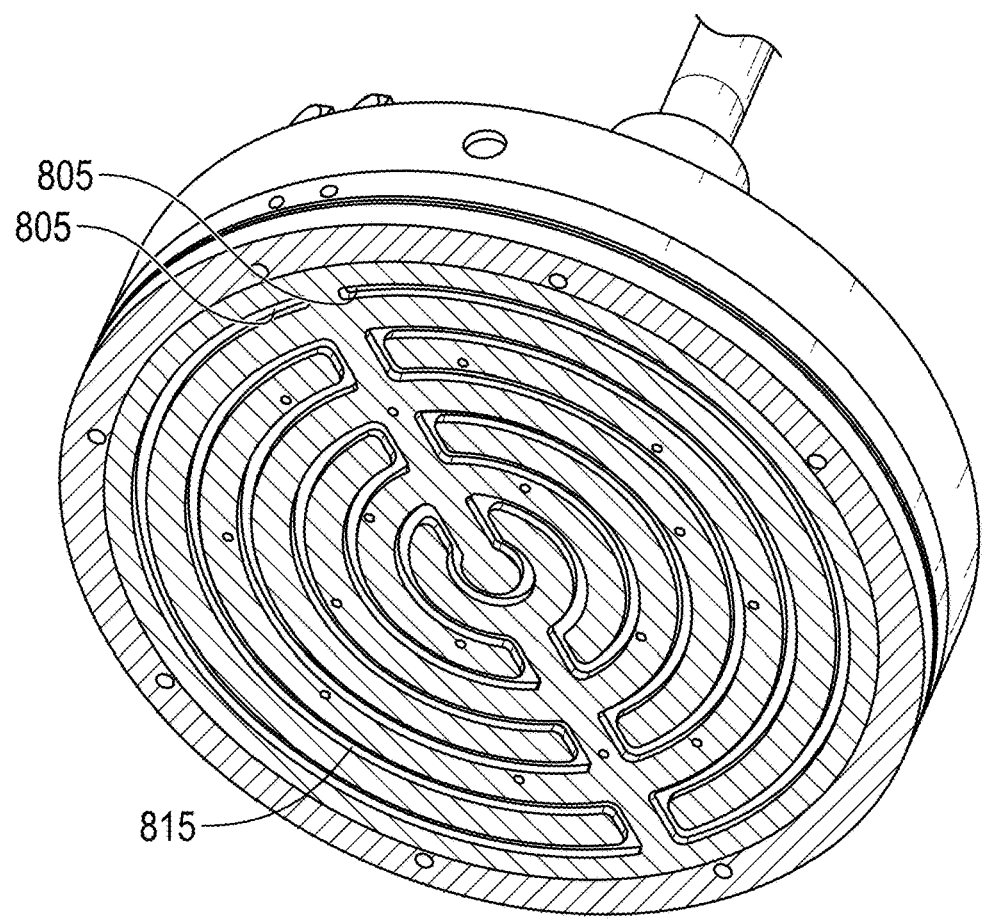
FIG. 12 is a cross-sectional perspective view of the bottom plate, with the cross-section taken along line C-C of FIG. 10.

Aspects of this disclosure can also be applied to other CMP systems, without the use of a resilient membrane. For example, FIGS. 9-12 illustrate an embodiment of a "rigid backed" substrate carrier that can be used as part of a substrate carrier system (e.g., the system of FIG. 4A or 4B) to control the temperature of a substrate in accordance with aspects of this disclosure. In particular, FIG. 9 is a perspective view of another embodiment of a substrate carrier that can be used as part of a substrate carrier system to control the temperature of a substrate in accordance with aspects of this disclosure. FIG. 10 is a cross-sectional view of the substrate carrier of FIG. 9 taken along line A-A of FIG. 9. FIG. 11 is another cross-sectional view of the substrate carrier of FIG. 9 taken along line B-B of FIG. 9. FIG. 12 is another cross-sectional view of the bottom plate taken along line C-C of FIG. 10.

With reference to FIGS. 9-10, an inlet line and an outlet line 805 provide a path for a liquid to be circulated through a wafer support plate 310. The support plate includes an upper plate and a lower plate which can be joined together, forming a liquid cavity therebetween (e.g., a liquid cooling passageway) 815. The upper and lower plates can be joined together to form a joining seam 810 by, for example, furnace brazing. The liquid cooling channel 815 can be machined into the lower plate then the lower plate and the upper plate can be furnace brazed together to form sealed the liquid cooling passageway 815. Similar to the embodiments illustrated in FIGS. 3 and 8, the substrate carrier head can include a carrier body 21 to support various components of the carrier head. The carrier head can include a substrate retainer 20 attached to the carrier body 21. The support plate 310 may be attached to each of the carrier body 21 and the substrate retainer 20. In some embodiments, the entire perimeter of the plate 310 (including the upper portion of plate 310) can be surrounded by the retainer 20 and/or body 21.

In the embodiment of FIGS. 9-12, the support plate 310 and substrate retainer 20 can retain and support a substrate without the use of a resilient membrane. Since the substrate carrier does not include a resilient membrane in some embodiments, the substrate carrier can be rigid. Although not illustrated, a carrier film may be included between the support plate 310 and the substrate to provide a cushion between the substrate and the support plate 310. As illustrated in FIG. 12, the liquid cooling passageway may be routed to cover substantially the entire area of the support plate 310 such that no portion of the support plate 310 is greater than a threshold distance away from the liquid cooling passageway. The liquid cooling passageway may be machined into one or more of the bottom plate and the upper plate of the support plate 310. Thus, the substrate carrier can be used to provide temperature control (e.g., cool) a substrate (such as a substrate formed of silicon carbide or other material) as described above in connection with the resilient membrane embodiments. For example, a system similar to that illustrated in FIG. 4A or 4B in which the membrane cavity 360 is replaced with a liquid cooling passageway can be used to circulate or recirculate a liquid for cooling of a substrate during CMP.

CMP System with Temperature Controlled Polishing Pad

As described above, chemical mechanical polishers can use a combination of down force (pressure), platen speed (friction) and abrasive chemistry to remove material from many different substrates. These include but are not limited to, silicon, AlTiC, GaSi, SiC, glass, quartz, and other material. The amount of pressure and friction applied to the wafer can be limited by the temperature of the pad the wafer is contacting. High temperatures can cause pad failure resulting in deformation, melting, glazing, and chemistry (e.g., the slurry chemistry) breakdowns. Therefore, in certain implementation, the amount and/or speed of removal is not limited by the mechanical systems but by the inability to remove the heat generated by the process. If the heat can be effectively removed, then the machine's mechanical systems can be pushed to their limits and increase the removal rates. This can provide higher throughput and the ability to run processes not currently available.

Figure 13:
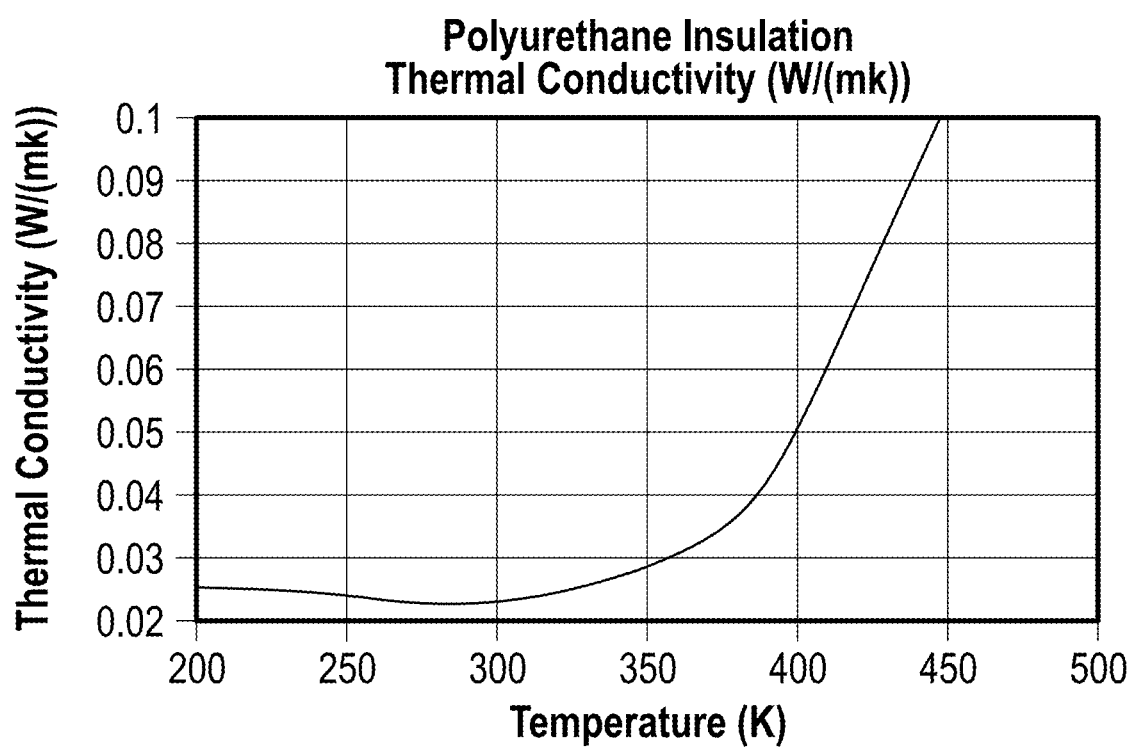
FIG. 13 is a plot illustrating the thermal conductivity for a polyurethane as a function of temperature.

FIG. 13 is a plot illustrating the thermal conductivity for a polyurethane as a function of temperature. In particular, FIG. 13 shows why the thermal management of heat in a polyurethane pad can be difficult. Because bulk polyurethane has a relatively poor thermal conductivity ($\lambda$), thermal management can be challenging when using polyurethane pads. In certain embodiments, the normal operating temperatures for these pads are between 293K (20° C.) to 323K (50° C.) 0.0225-0.0275 W/mK.

There may be limitations to the amount of pad heat that can be removed by thermal conduction to the platen, even when platen cooling is used. In addition, the removal of heat by convection and radiation may be negligible at the typical operating temperatures for the pads.

Figure 14A:
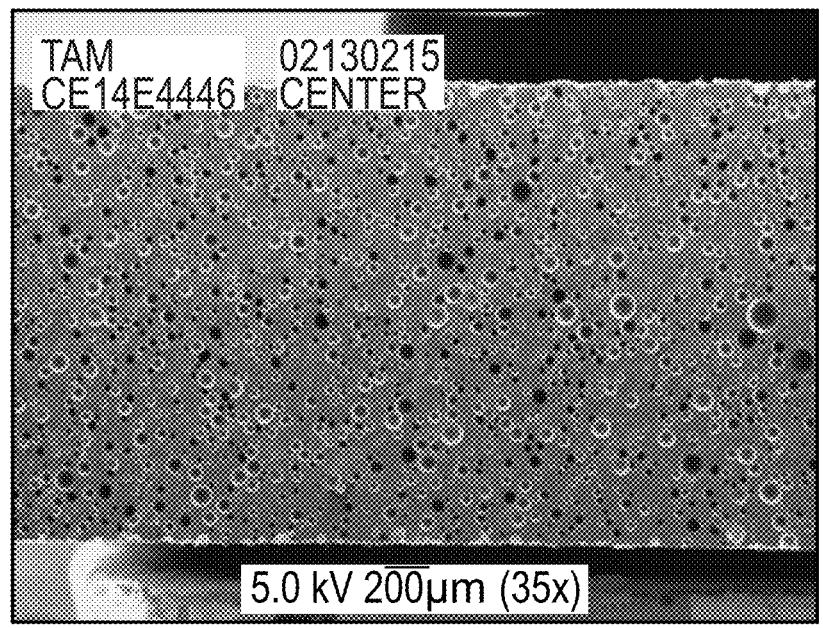
FIG. 14A is a SEM image of an IC1000 microporous polyurethane (MPU) pad.
Figure 14B:
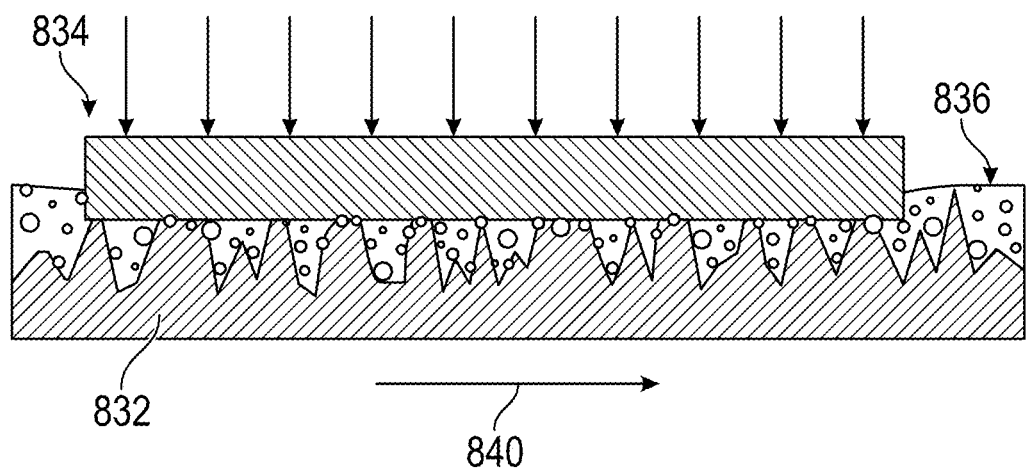
FIG. 14B is a cross-sectional view of a polishing pad and wafer during CMP in accordance with aspects of this disclosure.

FIG. 14A is a SEM image 830 of an IC1000 microporous polyurethane (MPU) polishing pad. FIG. 14B is a cross-sectional view of a polishing pad 832 and wafer 834 during CMP in accordance with aspects of this disclosure. The presence of the micropores in the example IC1000 microporous polyurethane (MPU) pad 832 can significantly reduce the thermal conductivity (k). One technique that can be used to remove heat from the pad 832 is to cool the pad 832 surface. In some embodiments, a liquid can be used to cool the pad 832. For example, water is a very good cooling medium. However, using water in volumes greater than 10 ml/m can result in diluting the slurry 836 being used to polish the wafer 834 and negate the benefits of the increased pressure 838 and speed 840 by decreasing the removal rate.

In order to prevent the added liquid from diluting the surface, the liquid (e.g., water) can be delivered in a way to exploit the liquid's latent heat of vaporization. Water is well suited to pad surface cooling due to water's latent heat of vaporization, which is about 2260 J/g. Thus, a low amount of water can be used to cool the pad, thereby cooling the pad without substantially affecting the slurry 836 chemistry. In some embodiments, the amount of water used to cool the pad may be low enough to result in a net improvement in the removal rate when considering any drops in the removal rate due to changes in the slurry 836 chemistry.

Figure 15:
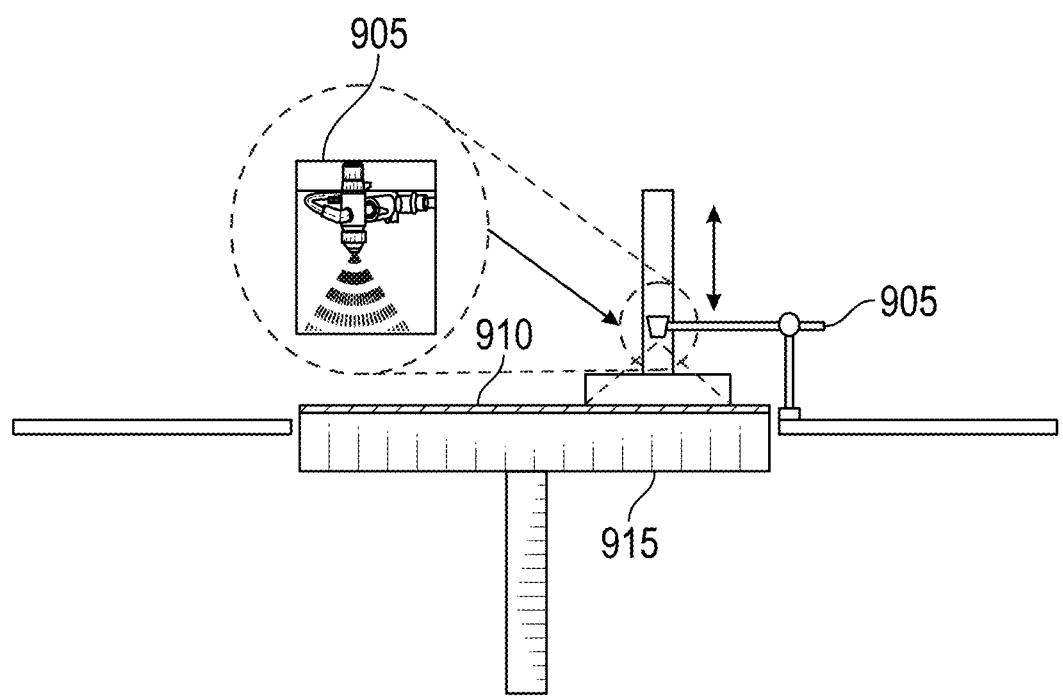
FIG. 15 is schematic illustration of a substrate processing system including an integrated atomizer system in accordance with aspects of this disclosure.

FIG. 15 is schematic illustration of a substrate processing system including an atomizer system in accordance with aspects of this disclosure. As shown in FIG. 15, the system can include an atomizer 905 configured to atomize the liquid and spread a very thin layer of the liquid over a large surface area of the pad 910 (which can be secured to a platen 915) to allow the water to evaporate and pull the heat directly from the surface of the pad 910. The amount of heat removed in Watts for one embodiment, a flow rate of 0.1 ml/s×2260 J/g=226 W was calculated. Experimentation using a hot plate with an ammeter demonstrated that the actual value of the wattage to be 204 W for an example flow rate of 0.1 ml/s. In various examples, provided below, the system including an atomizer 905 was able to lower the temperature of the pad by 14° C. (25.2° F.).

Comparative Examples for Pad Cooling Using Liquid Atomizers

Below, experimental data is provided for a number of experiments run to test the cooling of a polishing pad using the liquid cooling described herein. For each of experiments 1, 2, 4, and 5 listed below, a wafer formed of AlTiC was used.

Experiment 1—shown in Table 1 (high pressure, high speed, no chiller cooling to platen, no carrier cooling, no atomizer)

TABLE 1

| Parameter | Measured Value |
| --- | --- |
| Main Membrane (MM) Pressure | 3.5 psi (Gas) |
| Neslab Chiller | n/a |
| Atomizer | n/a |
| Platen Speed | 93 rpm |
| Spindle Speed | 87 rpm |
| Platen Temperature | 50° C. - 2 minute run time, temperature still rising |
| Platen Delta T | n/a |
| Carrier Delta R | n/a |
| Platen Flow | n/a |
| Carrier Flow | n/a |

Experiment 2—shown in Table 2 (high pressure, high speed, no chiller cooling to platen, no carrier cooling, atomizer activated)

TABLE 2

| Parameter | Measured Value |
|---|---|
| Main Membrane (MM) Pressure | 3.5 psi (Gas) |
| Neslab Chiller | n/a |
| Atomizer | 4 ml @ 180 psi (Note: Turned Atomizer OFF, Temperature rose rapidly) |
| Platen Speed | 93 rpm |
| Spindle Speed | 87 rpm |
| Platen Temperature | 38.9° C. - 2 minute run time, steady temperature |
| Platen Delta T | n/a |
| Carrier Delta R | n/a |
| Platen Flow | n/a |
| Carrier Flow | n/a |

Figure 16:
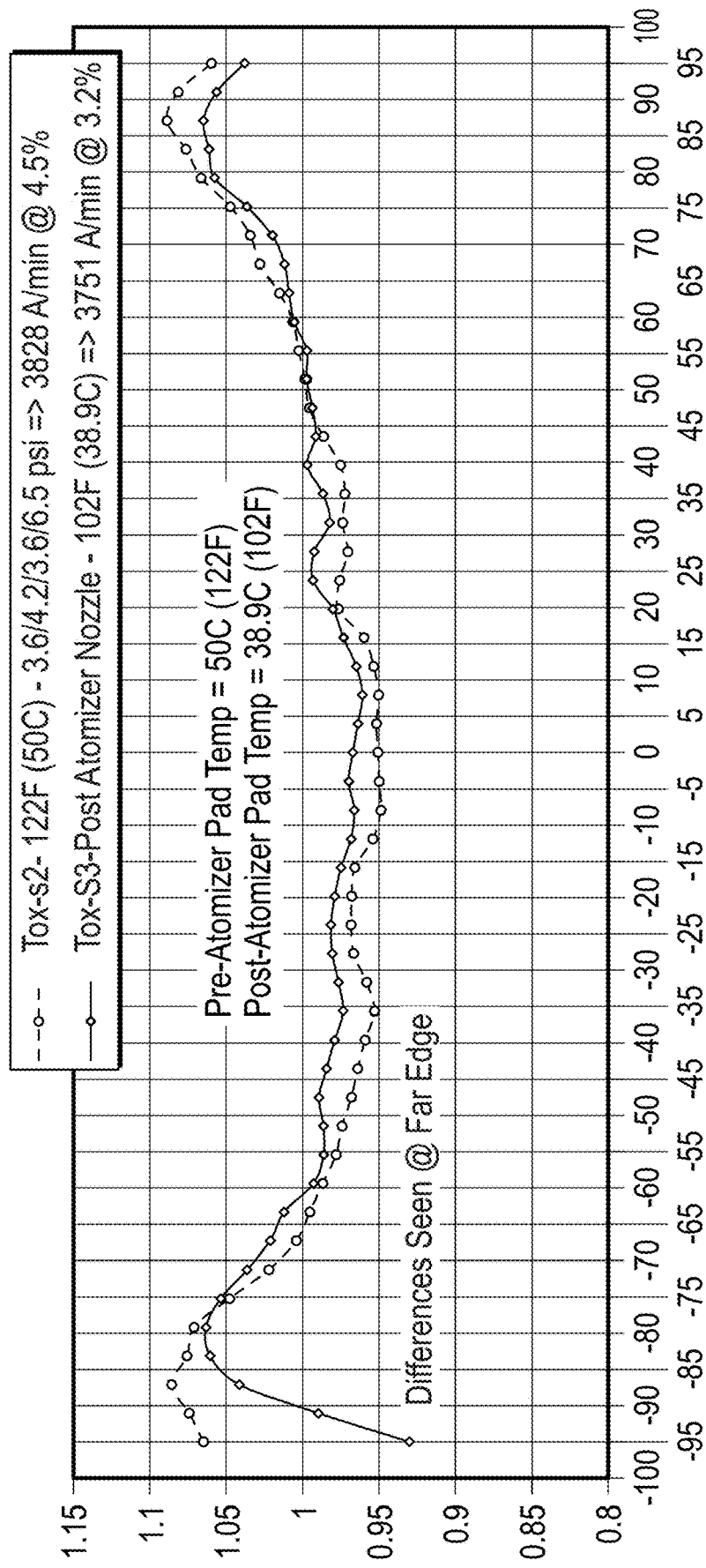
FIG. 16 is plot illustrating the difference in pad temperature between Experiment 1 and Experiment 2.

FIG. 16 is plot for Experiment 3 illustrating the normalized removal rates and temperatures for pre- and post-atomizer nozzle application for a Si wafer.

Experiment 4—shown in Table 3 (high pressure, high speed, no chiller cooling to platen, carrier cooling activated, no atomizer)

TABLE 3

| Parameter | Measured Value |
|---|---|
| Main Membrane (MM) Pressure | 6 psi (Liquid) |
| Neslab Chiller | 8° C. |
| Atomizer | n/a |
| Platen Speed | 125 rpm |
| Spindle Speed | 120 rpm |
| Platen Temperature | 52° C. - 5 minute run time, steady temperature |
| Platen Delta T | n/a |
| Carrier Delta R | 4.5° C. Q = 141.21 J/s - End of Run Wafer Temperature 40° C. |
| Platen Flow | n/a |
| Carrier Flow | 450 ml/m |

Experiment 5—shown in Table 4 (high pressure, high speed, no chiller cooling to platen, carrier cooling activated, atomizer activated)

TABLE 4

| Parameter | Measured Value |
|---|---|
| Main Membrane (MM) Pressure | 6 psi (Liquid) |
| Neslab Chiller | 8° C. |
| Atomizer | 4 ml @ 180 psi (Note: Turned Atomizer OFF, Temperature Rose Rapidly) |
| Platen Speed | 125 rpm |
| Spindle Speed | 120 rpm |
| Platen Temperature | 38° C. - 5 minute run time, steady temperature |
| Platen Delta T | n/a |
| Carrier Delta R | 3° C. Q = 94.14 J/s - End of Run Wafer Temperature 35° C. |
| Platen Flow | n/a |
| Carrier Flow | 450 ml/m |

CMP System with Retaining Ring

Figure 17:
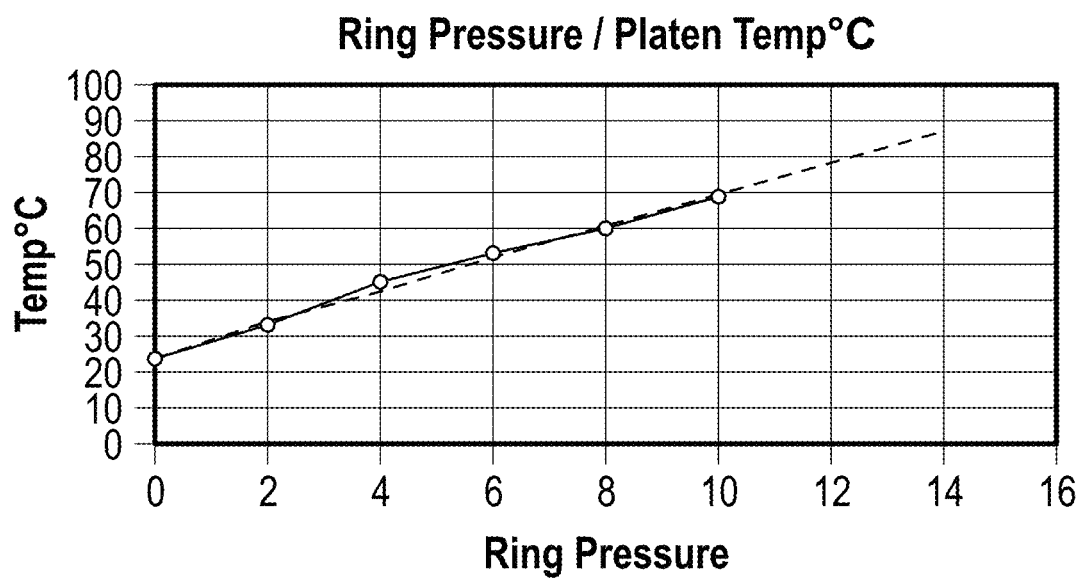
FIG. 17 is a plot illustrating the relationship between ring pressure (psi) and platen temperature (° C.) for a CMP system using a retaining ring.

FIG. 17 is a plot illustrating the relationship between ring pressure (psi) and platen temperature (° C.) for a CMP system using a retaining ring. As shown in FIG. 17, there is a substantially linear relationship between the ring pressure and the platen temperature.

In an example embodiment, a retaining ring may have a surface area of 18.9 square inches. A commanded downforce of about 240 lbs. is applied to the retaining ring of this embodiments can produce about 12.7 psi on the pad surface. In some embodiments, the system may provide a commanded pressure (e.g., in psi) to the ring. In one implementation, each psi to the ring will result in 24 lbs. of force. Reducing the contact area of the retaining ring by using another retaining ring that has a surface area of about 5 square inches can produce about 48 psi of applied pressure to the pad. A reduced contact area between the retaining ring and the polishing pad can also reduce heat generated during polishing, which is particularly advantageous for certain wafers such as silicon carbide wafers. Thus, pad pressure may be related to the surface area of the retaining ring since the downforce will be spread over the available surface area of the retaining ring. One effect of decreasing the contact area of the retaining ring may be an increase in the wear of the retaining ring. For example, a smaller retaining ring surface area with a higher applied pressure can result in faster retaining ring wear.

Figure 18:
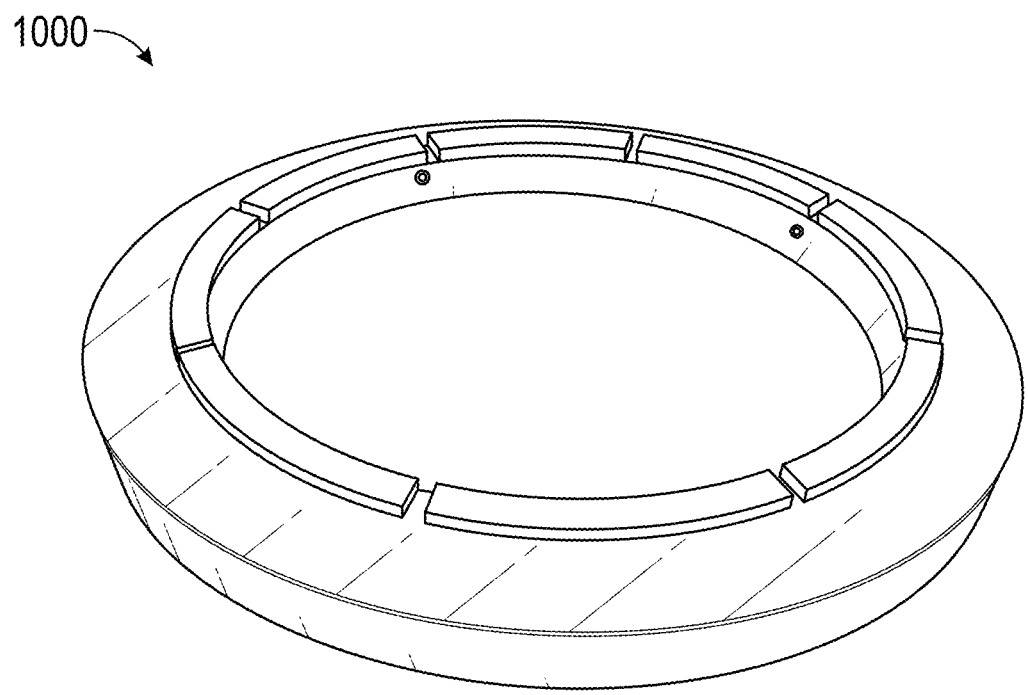
FIG. 18 illustrates a retaining ring having a stepped shape.

This increased wear in the retaining ring can be at least partially mitigated by altering the material of the portion of the retaining ring in contact with the pad to a harder material that is more wear resistant. However, use of such a hard material for the retaining ring may result in the wafer breaking due to the fragility of the wafer. Certain wafer types may be more fragile, and thus, more likely to break when using harder materials for the retaining ring. FIG. 18 illustrates a retaining ring 1000 having a stepped shape. Although not illustrated, in certain embodiments the retaining ring 1000 can be formed of two different materials. In particular, a different material, such as polyphenylene sulfide (PPS) or polyetheretherketone (PEEK), can be used where the wafer is touching the ring in order to prevent the retaining ring from breaking the wafer while still reducing the wear on the retaining ring.

In order to lower retaining ring wear, CMP processes disclosed herein can use a retaining ring 1000 having a low surface area and two-piece construction. For example, in some embodiments, the retaining ring may have a surface area of less than 15 square inches, less than 12 square inches, less than 10 square inches, less than 8 square inches, or less than 5 square inches for a 150 mm carrier. For example, the retaining ring 1000 can include an outer material that is hard and has a low wear rate such as aluminum oxide, zirconium oxide, boron nitride, boron carbide, silicon carbide, and stainless steel. The retaining ring 1000 can further include an inner material having an engineered polymer compatible with substrate contact, such as PPS, PEEK, Torlon, Rulon, polysulfone (PSU), Ultem polyetherimide (PEI), or polyvinylidene fluoride (PVDE).

The use of an outer material having sufficient hardness can minimize ring wear during CMP, increasing the lifetime of the retaining ring. As shown in FIG. 5, the retaining ring can also have a stepped contact surface for reduced contact area to reduce heat generated by contact between the face of the retaining ring and the polish pad.

SUMMARY

The atomizing systems described herein can include the use of any type of atomizing system to cool or remove energy and/or heat from the polishing pad of a CMP system. The atomizing system can use of any liquid medium in combination of any compressed gas through an orifice to cool or remove the energy and/or heat from the pad, thereby allowing for higher removal rates during CMP. Aspects of this disclosure also relate to the use of any adiabatic cooling system to cool or remove energy and/or heat from the pad.

In using the atomizer, the system can be further configured to control the temperature of the atomized fluid as an additional means for controlling pad surface temperature during CMP. Yet further aspects of this disclosure relate to applying a cooled and/or temperature-controlled gas (such as compressed air) flowing through a vortex-cooling nozzle as an additional means for cooling the pad surface without adversely affecting the CMP process and consumables.

The word "exemplary" is used herein to mean "serving as an example, instance, or illustration." Any aspect or embodiment described herein as "exemplary" is not necessarily to be construed as preferred or advantageous over other aspects or embodiments. Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of, or combined with, any other aspect described. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosures set forth herein. It should be understood that any aspect disclosed herein may be embodied by one or more elements of a claim.

It should also be understood that, unless a term is expressly defined in this patent using the sentence "As used herein, the term '______' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount, depending on the desired function or desired result.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products. For example, any of the components for an energy storage system described herein can be provided separately, or integrated together (e.g., packaged together, or attached together) to form an energy storage system.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

The headings provided herein, if any, are for convenience only and do not necessarily affect the scope or meaning of the devices and methods disclosed herein.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A substrate carrier head, comprising:
   a carrier body;
   a substrate retainer attached to the carrier body, the substrate retainer comprising an aperture configured to receive a substrate;
   a resilient membrane having a first surface configured to contact a surface of the substrate and a second surface opposing the first surface;
   a membrane cavity formed along the second surface of the resilient membrane;
   an inlet configured to allow liquid to flow into the membrane cavity;
   an outlet configured to allow liquid to flow from the membrane cavity;
   a regulator upstream of the inlet and configured to regulate a flow-rate of the liquid through the membrane cavity; and
   a liquid flow controller including a control processor configured to control the regulator to regulate the flow of the liquid through the membrane cavity during planarization of the substrate such that the flow-rate of the liquid is sufficient through the membrane cavity to adjust a temperature of the substrate during processing of the substrate.

2. The substrate carrier head of claim 1, wherein the outlet is located at a farther radial position from a center of the carrier body than the inlet.

3. The substrate carrier head of claim 2, wherein the inlet is located at approximately the center of the carrier body.

4. The substrate carrier head of claim 1, further comprising:
   a secondary resilient membrane having a width that is less than a width of the resilient membrane.

5. The substrate carrier head of claim 1, further comprising a liquid tight seal between the resilient membrane and the carrier body.

6. The substrate carrier head of claim 1, wherein the control processor is further configured to control the flow of the liquid to have a sufficient flow-rate through the membrane cavity to remove excess heat generated during the processing of the substrate.

7. The substrate carrier head of claim 1, further comprising:
   a heat exchanger configured to cool the liquid before the liquid is provided to the inlet in order to cool the substrate.

8. The substrate carrier head of claim 1, further comprising:
   a heat exchanger configured to heat the liquid before the liquid is provided to the inlet in order to heat the substrate.

9. A substrate carrier system, comprising:
   a substrate carrier head, comprising:
      a carrier body;
      a substrate retainer attached to the carrier body, the substrate retainer configured to retain a substrate on the carrier body;
      a resilient membrane having a first surface configured to contact a surface of the substrate and a second surface opposing the first surface; and
      a membrane cavity formed along the second surface of the resilient membrane, the membrane cavity configured to allow a liquid to flow along the second surface;
   one or more regulators upstream of the membrane cavity; and
   a control system including a control processor configured to control a temperature of the substrate to within a threshold of a target temperature by controlling the one or more regulators to regulate a flow-rate of the liquid through the membrane cavity during processing of the substrate.

10. The substrate carrier system of claim 9, wherein the substrate carrier head further comprises:
    an inlet configured to allow liquid to flow into the membrane cavity; and
    an outlet configured to allow liquid to flow from the membrane cavity.

11. The substrate carrier system of claim 10, wherein the outlet is further configured to recirculate the liquid back into the inlet.

12. The substrate carrier system of claim 10, wherein the outlet is located at a farther radial position from a center of the carrier body than the inlet.

13. The substrate carrier system of claim 12, wherein the inlet is located at approximately the center of the carrier body.

14. The substrate carrier system of claim 9, further comprising:
    a heat exchanger configured to cool the liquid below an ambient temperature.

15. The substrate carrier system of claim 9, further comprising:
    a liquid source fluidly connected to the membrane cavity via a first one of the one or more regulators.

16. The substrate carrier system of claim 9, wherein the substrate carrier head further comprises:

a secondary resilient membrane having a width that is less than a width of the resilient membrane.

17. The substrate carrier system of claim 16, wherein the resilient membrane is substantially entirely imperforated.

18. The substrate carrier system of claim 9, further comprising:
a fluid back pressure regulator downstream of the membrane cavity and configured to control a liquid pressure of the liquid within the membrane cavity to control a pressure applied to the substrate during processing of the substrate.

19. The substrate carrier system of claim 9, further comprising:
a pressure ring configured to form the membrane cavity, the pressure ring including one or more channels through which the liquid flows from a first side of the pressure ring to a second side of the pressure ring.

20. The substrate carrier system of claim 9, wherein the control system is further configured to: i) measure the flow-rate of the liquid, a pressure of the liquid, and/or a temperature of the liquid, and ii) control the one or more regulators to regulate the flow-rate of the liquid based on the measured flow-rate of the liquid, the measure pressure of the liquid, and/or the measured temperature of the liquid.

21. A method for cooling a substrate during chemical mechanical polishing (CMP) of the substrate, the method comprising:
retaining a substrate within an aperture of a substrate retainer, the substrate retainer attached to a carrier body of a carrier head including a resilient membrane;
supplying a liquid to a membrane cavity within the carrier head, the membrane cavity formed along a surface of the resilient membrane; and
using a regulator located upstream of the membrane cavity to control a flow-rate of the liquid through the membrane cavity during the CMP of the substrate such that the flow-rate of the liquid through the membrane cavity is sufficient to adjust a temperature of the substrate during processing of the substrate.

22. The method of claim 21, further comprising:
flowing the liquid through an inlet into the membrane cavity; and
flowing the liquid through an outlet from the membrane cavity.

23. The method of claim 22, further comprising:
recirculating the liquid from the outlet back into the inlet.

24. The method of claim 21, further comprising:
cooling the liquid below an ambient temperature.

* * * * *